United States Patent
Li et al.

(10) Patent No.: US 12,074,257 B2
(45) Date of Patent: Aug. 27, 2024

(54) LIGHT EMITTING APPARATUS, MANUFACTURING METHOD THEREOF, AND DISPLAY APPARATUS PROVIDED THEREWITH

(71) Applicant: Samsung Display Co., Ltd., Yongin-si (KR)

(72) Inventors: Xinxing Li, Yongin-si (KR); Dae Hyun Kim, Yongin-si (KR); Veidhes Basrur, Yongin-si (KR); Hee Keun Lee, Yongin-si (KR); Chang Il Tae, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 906 days.

(21) Appl. No.: 17/258,419

(22) PCT Filed: Dec. 20, 2018

(86) PCT No.: PCT/KR2018/016360
§ 371 (c)(1),
(2) Date: Jan. 6, 2021

(87) PCT Pub. No.: WO2020/013408
PCT Pub. Date: Jan. 16, 2020

(65) Prior Publication Data
US 2021/0296538 A1    Sep. 23, 2021

(30) Foreign Application Priority Data
Jul. 10, 2018  (KR) .................. 10-2018-0080152

(51) Int. Cl.
*H01L 27/15* (2006.01)
*H01L 33/00* (2010.01)
*H01L 33/38* (2010.01)

(52) U.S. Cl.
CPC .......... *H01L 33/382* (2013.01); *H01L 27/156* (2013.01); *H01L 33/005* (2013.01); *H01L 2933/0016* (2013.01)

(58) Field of Classification Search
CPC ............... H01L 25/0753; H01L 25/167; H01L 2933/0066; H01L 33/20; H01L 33/54; H01L 33/56
See application file for complete search history.

(56) References Cited

U.S. PATENT DOCUMENTS 8,872,214 B2   10/2014  Negishi et al.
9,229,236 B2    1/2016  Hino et al.
(Continued)

FOREIGN PATENT DOCUMENTS

EP    3 270 413 A1    1/2018
JP    4814394 B2     11/2011
(Continued)

OTHER PUBLICATIONS

International Search Report for corresponding International Application No. PCT/KR2018/016360, dated May 30, 2019, 3pp.

*Primary Examiner* — Jaehwan Oh
(74) *Attorney, Agent, or Firm* — Lewis Roca Rothgerber Christie LLP

(57) ABSTRACT

The present application relates to a light emitting device, manufacturing method thereof, and a display device provided therewith. The light emitting device may include: a substrate; a first electrode provided on the substrate, and a second electrode disposed on a plane identical with a plane of the first electrode at a position spaced apart from the first electrode; at least one light emitting element provided on the substrate, and including a first end and a second end with respect to a longitudinal direction; a bridge pattern provided on the light emitting element, and coupled to the second end of the light emitting element; a first contact electrode
(Continued)

provided on the substrate, and coupling the first electrode with the first end of the light emitting element; and a second contact electrode provided on the substrate, and coupling the bridge pattern with the second electrode.

15 Claims, 25 Drawing Sheets

(56) References Cited

U.S. PATENT DOCUMENTS

| | | | |
|---|---|---|---|
| 9,287,242 | B2 | 3/2016 | Shibata et al. |
| 9,570,425 | B2 | 2/2017 | Do |
| 9,773,761 | B2 | 9/2017 | Do |
| 10,185,430 | B2 | 1/2019 | Zhu et al. |
| 10,276,630 | B2 | 4/2019 | Lee et al. |
| 10,461,123 | B2 | 10/2019 | Kim et al. |
| 2011/0089850 | A1 | 4/2011 | Shibata et al. |
| 2018/0012876 | A1 | 1/2018 | Kim et al. |
| 2018/0175104 | A1* | 6/2018 | Kang .................... H01L 33/005 |
| 2018/0175106 | A1* | 6/2018 | Kim ........................ H01L 33/60 |
| 2019/0035980 | A1 | 1/2019 | Do et al. |

FOREIGN PATENT DOCUMENTS

| | | |
|---|---|---|
| JP | 4914929 B2 | 4/2012 |
| JP | 2017-503292 A | 1/2017 |
| KR | 10-2013-0080412 A | 7/2013 |
| KR | 10-2014-0085331 A | 7/2014 |
| KR | 10-1436123 B1 | 11/2014 |
| KR | 10-1490758 B1 | 2/2015 |
| KR | 10-2017-0033485 A | 3/2017 |
| KR | 10-2017-0091805 A | 8/2017 |
| KR | 10-2018-0007025 A | 1/2018 |
| KR | 10-2018-0011404 A | 2/2018 |
| KR | 10-2018-0071465 A | 6/2018 |
| KR | 10-2018-0072909 A | 7/2018 |

* cited by examiner

LIGHT EMITTING APPARATUS, MANUFACTURING METHOD THEREOF, AND DISPLAY APPARATUS PROVIDED THEREWITH

CROSS-REFERENCE TO RELATED APPLICATIONS

This application is a National Phase Patent Application of International Patent Application Number PCT/KR2018/016360, filed on Dec. 20, 2018, which claims priority of Korean Patent Application No. 10-2018-0080152, filed Jul. 10, 2018. The entire contents of both of which are incorporated herein by reference.

TECHNICAL FIELD

Various embodiments of the present disclosure relate to a light emitting device, a method of fabricating the light emitting device, and a display device having the light emitting device.

BACKGROUND ART

A light emitting diode (LED) may have relatively satisfactory durability even under poor environmental conditions, and have excellent performances in terms of lifetime and luminance. Recently, research on the technology of applying such LEDs to various display devices has become appreciably more active.

As a part of such research, technologies of fabricating a rod-type LED having a small size corresponding to the micro scale or the nano scale using an inorganic crystalline structure, e.g., a structure obtained by growing a nitride-based semiconductor are being developed. For example, rod-type LEDs may be fabricated in a small size enough to form a pixel of a self-luminance display device, etc.

DISCLOSURE

Technical Problem

Various embodiments of the present disclosure are directed to a light emitting device in which contact failures of rod-type light emitting diodes can be minimized, a method of fabricating the light emitting device, and a display device having the light emitting device.

Technical Solution

According to an aspect of the present disclosure, a light emitting device may include: a substrate; a first electrode provided on the substrate, and a second electrode disposed on a plane identical with a plane of the first electrode at a position spaced apart from the first electrode; at least one light emitting element provided on the substrate, and including a first end and a second end with respect to a longitudinal direction; a bridge pattern provided on the light emitting element, and coupled to the second end of the light emitting element; a first contact electrode provided on the substrate, and coupling the first electrode with the first end of the light emitting element; and a second contact electrode provided on the substrate, and coupling the bridge pattern with the second electrode.

In some embodiments, the light emitting device may further include an insulating pattern provided on the bridge pattern.

In some embodiments, the insulating pattern may overlap with the bridge pattern in a plan view.

In some embodiments, each of the bridge pattern and the insulating pattern may include a first end adjacent to the first electrode, and a second end opposite to the first end of itself.

In some embodiments, the first end of the insulating pattern may be disposed at a position closer to the first electrode than is the first end of the bridge pattern. The second end of the insulating pattern may be disposed at a position closer to the first electrode than is the second end of the bridge pattern, and the second end of the bridge pattern may be exposed to an outside.

In some embodiments, the first contact electrode may be provided on the insulating pattern.

In some embodiments, the light emitting device may further include a void enclosed by a portion of an upper surface of the light emitting element, the first end of the bridge pattern, the first end of the insulating pattern, and a portion of the first contact electrode.

In some embodiments, the first contact electrode may be electrically separated from the bridge pattern.

In some embodiments, the light emitting device may further include an insulating layer provided on the first and the second electrodes. The insulating layer may include a first contact hole through which a portion of the first electrode is exposed, and a second contact hole through which a portion of the second electrode is exposed.

In some embodiments, the first contact electrode may be coupled to the first electrode through the first contact hole. The second contact electrode may be coupled to the second electrode through the second contact hole, and coupled to the exposed second end of the bridge pattern.

In some embodiments, the light emitting element may include: a first semiconductor layer (or a first conductive semiconductor layer) doped with a first conductive dopant; a second semiconductor layer (or a second conductive semiconductor layer) doped with a second conductive dopant; and an active layer disposed between the first conductive semiconductor layer and the second conductive semiconductor layer.

In some embodiments, the first conductive semiconductor layer may be disposed on the first end of the light emitting element, and the second conductive semiconductor layer may be disposed on the second end of the light emitting element. The first conductive semiconductor layer may include an n-type semiconductor layer, and the second conductive semiconductor layer may include a p-type semiconductor layer.

In some embodiments, the first and the second contact electrodes may be provided on an identical layer.

The above-described light emitting device can be manufactured by a method including forming, on a substrate, a first electrode and a second electrode disposed on a plane identical with a plane of the first electrode at a position spaced apart from the first electrode; forming a first insulating material layer on the substrate including the first and the second electrodes; self-aligning light emitting elements on the first insulating material layer; sequentially forming a conductive layer and a second insulating material layer on the first insulating material layer including the light emitting elements; patterning the conductive layer and the second insulating material layer through a first etching process, and forming a bridge pattern with opposite ends each having an undercut shape by etching the patterned conductive layer through a second etching process using the patterned second insulating material layer as a mask; forming, by patterning the first insulating material layer, a first insulating layer allowing a portion of the first electrode and a portion of the second electrode to be exposed; forming, by patterning the patterned second insulating material layer used as the mask, an insulating pattern allowing one of opposite ends of the bridge pattern to be exposed; and forming, on the first insulating layer, a first contact electrode electrically coupled to the first electrode, and a second contact electrode electrically coupled to the second electrode.

According to an aspect of the present disclosure, a display device may include: a substrate including a display area and a non-display area; a pixel circuit layer provided in the display area, and including at least one transistor; and a display element layer provided on the pixel circuit layer, and including a plurality of unit emission areas from which light is emitted.

Each of the unit emission areas of the display element layer may include: a first electrode provided on the pixel circuit layer, and a second electrode disposed on a plane identical with a plane of the first electrode at a position spaced apart from the first electrode; at least one light emitting element provided on the pixel circuit layer, and including a first end and a second end with respect to a longitudinal direction; a bridge pattern provided on the light emitting element, and coupled to the second end of the light emitting element; an insulating pattern provided on the bridge pattern; a first contact electrode provided on the insulating pattern, and coupling the first electrode with the first end of the light emitting element; and a second contact electrode provided on the pixel circuit layer, and coupling the bridge pattern with the second electrode.

The display element layer may further include a void enclosed by a portion of an upper surface of the light emitting element, an end of the bridge pattern, an end of the insulating pattern, and a portion of the first contact electrode.

Effects

Various embodiments of the present disclosure may provide a light emitting device in which contact failures of rod-type light emitting diodes can be prevented from occurring, a method of fabricating the light emitting device, and a display device having the light emitting device.

MODE FOR EMBODIMENTS

Figure 1:
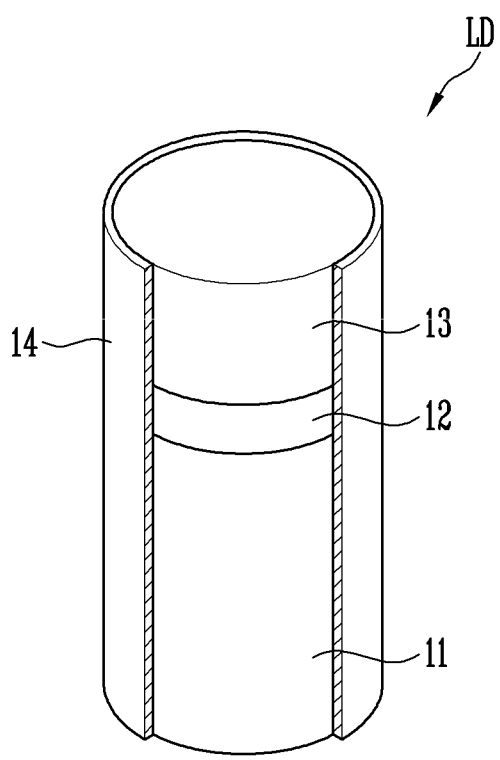
FIG. 1 is a perspective view illustrating a rod-type light emitting diode (LED) in accordance with some embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Embodiments of the present disclosure will hereinafter be described in detail with reference to the accompanying drawings.

FIG. 1 is a perspective view illustrating a rod-type light emitting diode in accordance with some embodiments of the present disclosure. Although in FIG. 1 the rod-type light emitting diode LD having a cylindrical shape has been illustrated, the present disclosure is not limited thereto.

Referring to FIG. 1, the rod-type light emitting diode LD in accordance with some embodiments of the present disclosure may include a first conductive semiconductor layer 11, a second conductive semiconductor layer 13, and an active layer 12 interposed between the first and second conductive semiconductor layers 11 and 13. The rod-type light emitting diode LD may be a light emitting element.

For example, the rod-type light emitting diode LD may be implemented as a stacked body formed by successively stacking the first conductive semiconductor layer 11, the active layer 12, and the second conductive semiconductor layer 13. In the following descriptions, for the sake of explanation, the rod-type light emitting diode LD will be referred to as "rod-type LED LD".

In some embodiments of the present disclosure, the rod-type LED LD may be provided in the form of a rod extending in one direction. If the direction in which the rod-type LED LD extends is defined as a longitudinal direction, the rod-type LED LD may have a first end and a second end with respect to the longitudinal direction.

In some embodiments, one of the first and second conductive semiconductor layers 11 and 13 may be disposed on the first end, and the other of the first and second conductive semiconductor layers 11 and 13 may be disposed on the second end.

In some embodiments, the rod-type LED LD may be provided in a cylindrical shape. Here, the term "rod type" embraces a rod-like shape and a bar-like shape such as a cylindrical shape and a prismatic shape extending in the longitudinal direction (i.e., to have an aspect ratio greater than 1). For example, the length of the rod-type LED LD may be greater than the diameter thereof.

The rod-type LED LD may be fabricated in a small size having a diameter and/or length corresponding to, e.g., a micro-scale or nano-scale size.

However, the size of the rod-type LED LD in accordance with some embodiments of the present disclosure is not limited to this, and the size of the rod-type LED LD may be changed depending on conditions of the display device to which the rod-type LED LD is applied.

The first conductive semiconductor layer 11 may include, for example, at least one n-type semiconductor layer. For instance, the first conductive semiconductor layer 11 may include a semiconductor layer which includes any one semiconductor material of InAlGaN, GaN, AlGaN, InGaN, AlN, and InN, and is doped with a first conductive dopant such as Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and have a single- or multi-quantum well structure. In some embodiments of the present disclosure, a cladding layer (not shown) doped with a conductive dopant may be formed on and/or under the active layer 12. For example, the cladding layer may be formed of an AlGaN layer or an InAlGaN layer. In addition, material such as AlGaN or AlInGaN may be employed to form the active layer 12.

If an electric field having a certain voltage or more is applied to the opposite ends of the rod-type LED LD, the rod-type LED LD emits light by coupling of electron-hole pairs in the active layer 12.

The second conductive semiconductor layer 13 may be provided on the active layer 12 and may include a semiconductor layer of a type that is different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material of InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In some embodiments of the present disclosure, the rod-type LED LD may not only include the first conductive semiconductor layer 11, the active layer 12, and the second conductive semiconductor layer 13, but may also include a fluorescent layer, another active layer, another semiconductor layer, and/or an electrode layer provided on and/or under each layer.

Furthermore, the rod-type LED LD may further include an insulating film 14. In some embodiments of the present disclosure, the insulating film 14 may be omitted, or may be provided to cover only some of the first conductive semiconductor layer 11, the active layer 12, and the second conductive semiconductor layer 13.

For example, the insulating film 14 may be provided on a portion of the rod-type LED LD that does not include the opposite ends of the rod-type LED LD, so that the opposite ends of the rod-type LED LD are exposed.

Although in FIG. 1 there is illustrated the insulating film 14 from which a portion thereof has been removed for the sake of explanation, the actual rod-type LED LD may be formed such that the entirety of the side surface of the cylindrical body thereof is enclosed by the insulating film 14.

The insulating film 14 may be provided to enclose at least a portion of an outer circumferential surface of the first conductive semiconductor layer 11, the active layer 12, and/or the second conductive semiconductor layer 13. For example, the insulating film 14 may enclose the outer circumferential surface of the active layer 12.

In some embodiments of the present disclosure, the insulating film 14 may include a transparent insulating material. For example, the insulating film 14 may include at least one insulating material selected from the group consisting of $SiO_2$, $Si_3N_4$, $Al_2O_3$, and $TiO_2$, but it is not limited thereto. In other words, various materials having insulating properties may be employed.

If the insulating film 14 is provided on the rod-type LED LD, the active layer 12 may be prevented from short-circuiting with a first and/or second electrode (not shown).

Furthermore, thanks to the insulating film 14, occurrence of a defect on the surface of the rod-type LED LD may be reduced or minimized, whereby the lifetime and efficiency of the rod-type LED LD may be improved. Even when a plurality of rod-type LEDs LD are disposed adjacent to each other, the insulating film 14 may prevent the rod-type LEDs LD from undesirably short-circuiting therebetween.

The above-described rod-type LED LD may be used as a light emitting source for various display devices. For example, the rod-type LED LD may be used as a light source element for a lighting apparatus or a self-emissive display device.

Figure 2A:
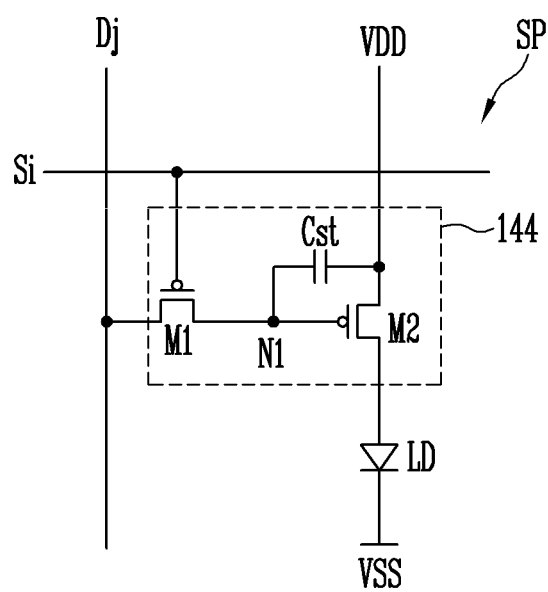
FIGS. 2a and 2b each are a diagram illustrating a unit emission area of a light emitting device in accordance with some embodiments of the present disclosure.
Figure 2B:
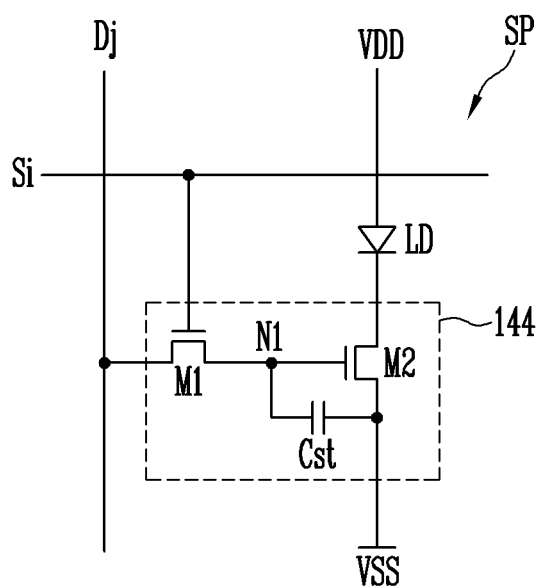

FIGS. 2a and 2b each are a diagram illustrating a unit emission area of a light emitting device in accordance with some embodiments of the present disclosure.

For example, FIGS. 2a and 2b illustrate examples of a pixel that forms an active emission display panel. In some embodiments of the present disclosure, the unit emission area may be a pixel area in which a single sub-pixel is provided.

Referring to FIG. 2a, a sub-pixel SP may include at least one rod-type LED LD, and a pixel driving circuit 144 that is coupled to the rod-type LED LD to drive the rod-type LED LD.

A first electrode (e.g., an anode electrode) of the rod-type LED LD may be coupled to a first driving power supply VDD via the pixel driving circuit 144, and a second electrode (e.g., a cathode electrode) of the rod-type LED LD may be coupled to a second driving power supply VSS.

The first driving power supply VDD and the second driving power supply VSS may have different potentials. For example, the second driving power supply VSS may have a potential lower than that of the first driving power supply VDD by a value that is equal to or greater than a threshold voltage of the rod-type LED LD.

Each of the rod-type LEDs LD may emit light at a luminance corresponding to a driving current that is controlled by the pixel driving circuit 144.

Although FIG. 2a illustrates an embodiment in which each of the sub-pixels SP includes only one rod-type LED LD, the present disclosure is not limited thereto. For example, the sub-pixel SP may include a plurality of rod-type LEDs LD coupled in parallel to each other.

In some embodiments of the present disclosure, the pixel driving circuit 144 may include first and second transistors M1 and M2, and a storage capacitor Cst. However, the structure of the pixel driving circuit 144 is not limited to the embodiment illustrated in FIG. 2a.

The first transistor (M1; switching transistor) includes a first electrode coupled to a data line Dj, and a second electrode coupled to a first node N1. Here, the first electrode and the second electrode of the first transistor M1 may be different electrodes. For example, if the first electrode is a source electrode, the second electrode is a drain electrode. Furthermore, the first transistor M1 includes a gate electrode coupled to the scan line Si.

When a scan signal having a voltage (e.g., a low-level voltage) capable of turning on the first transistor M1 is supplied from the scan line Si, the first transistor M1 is turned on to electrically couple the data line Dj with the first node N1. Here, a data signal of a corresponding frame is supplied to the data line Dj, whereby the data signal is transmitted to the first node N1. The data signal transmitted to the first node N1 is charged to the storage capacitor Cst.

The second transistor (M2; driving transistor) includes a first electrode coupled to the first driving power supply VDD, and a second electrode electrically coupled to the first electrode of each of the rod-type LEDs LD. The second transistor M2 includes a gate electrode coupled to the first node N1. The second transistor M2 may control the amount of driving current to be supplied to the rod-type LEDs LD in response to the voltage of the first node N1.

One electrode of the storage capacitor Cst is coupled to the first driving power supply VDD, and the other electrode thereof is coupled to the first node N1. The storage capacitor Cst may be charged with a voltage corresponding to the data signal supplied to the first node N1, and may maintain the charged voltage until a data signal of a subsequent frame is supplied.

For convenience sake, FIG. 2a illustrates the driving circuit 144 having a relatively simple structure including the first transistor M1 configured to transmit the data signal to the sub-pixel SP, the storage capacitor Cst configured to store the data signal, and the second transistor M2 configured to supply driving current corresponding to the data signal to the rod-type LED LD.

However, the present disclosure is not limited to the foregoing structure, and the structure of the driving circuit 144 may be changed in various ways. For example, the driving circuit 144 may further include at least one transistor element such as a transistor element configured to compensate for the threshold voltage of the second transistor M2, a transistor element configured to initialize the first node N1, and/or a transistor element configured to control an emission time of the rod-type LED LD, and/or may further include other circuit elements, such as a boosting capacitor for boosting the voltage of the first node N1.

Furthermore, although in FIG. 2a the transistors, e.g., the first and second transistors M1 and M2, included in the driving circuit 144 have been illustrated as being formed of P-type transistors, the present disclosure is not limited to this. In other words, at least one of the first and second transistors M1 and M2 included in the driving circuit 144 may be changed to an N-type transistor.

Referring to FIG. 2b, in some embodiments of the present disclosure, the first and second transistors M1 and M2 may be implemented as N-type transistors. The configuration and operation of the driving circuit 144 illustrated in FIG. 2b, other than a change in connection positions of some components due to a change in the type of transistor, are similar to those of the driving circuit 144 of FIG. 2a. Therefore, detailed descriptions pertaining to this will be omitted.

Figure 3:
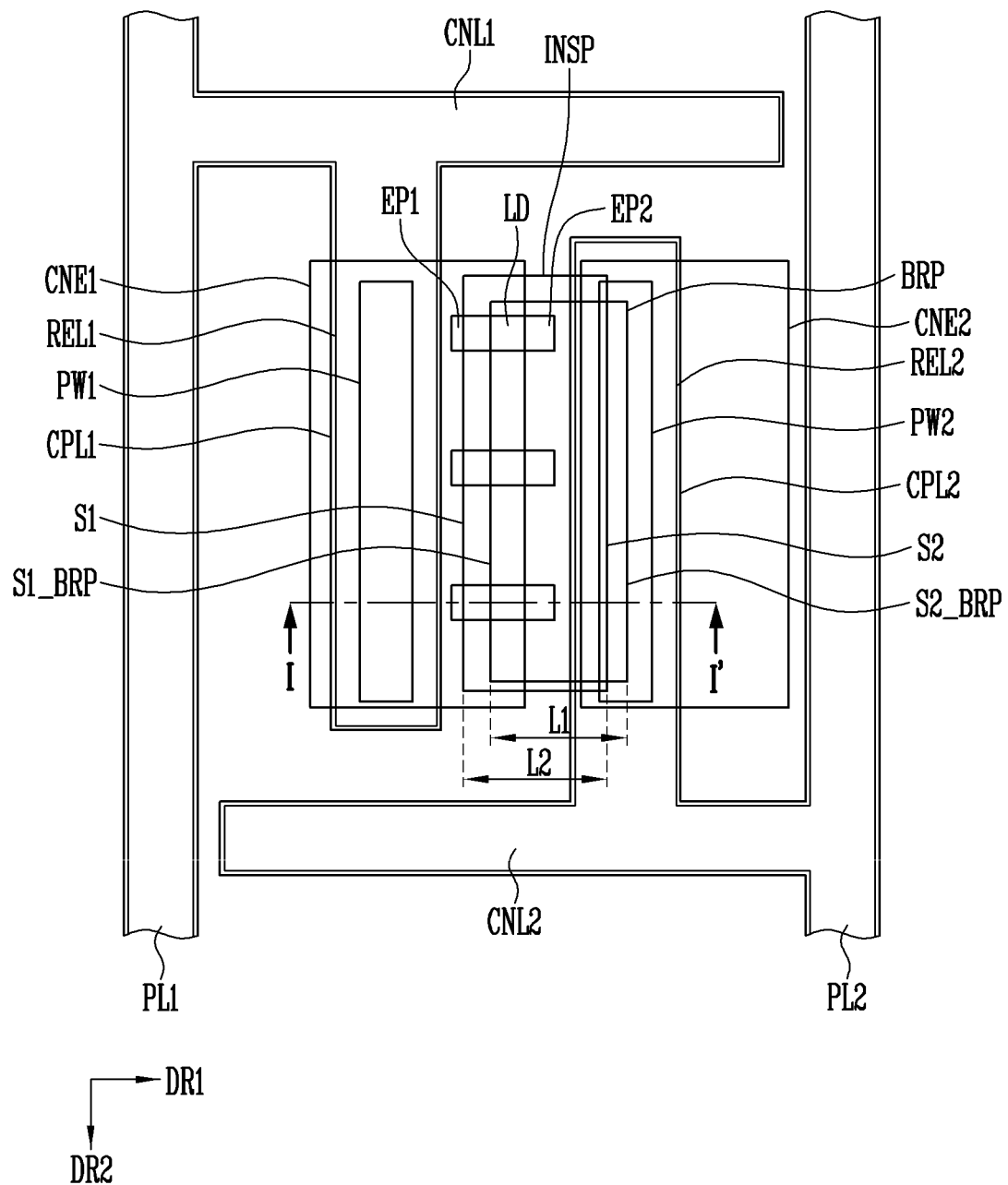
FIG. 3 is a plan diagram illustrating a unit emission area of the light emitting device including the rod-type light emitting diode of FIG. 1.
Figure 4:
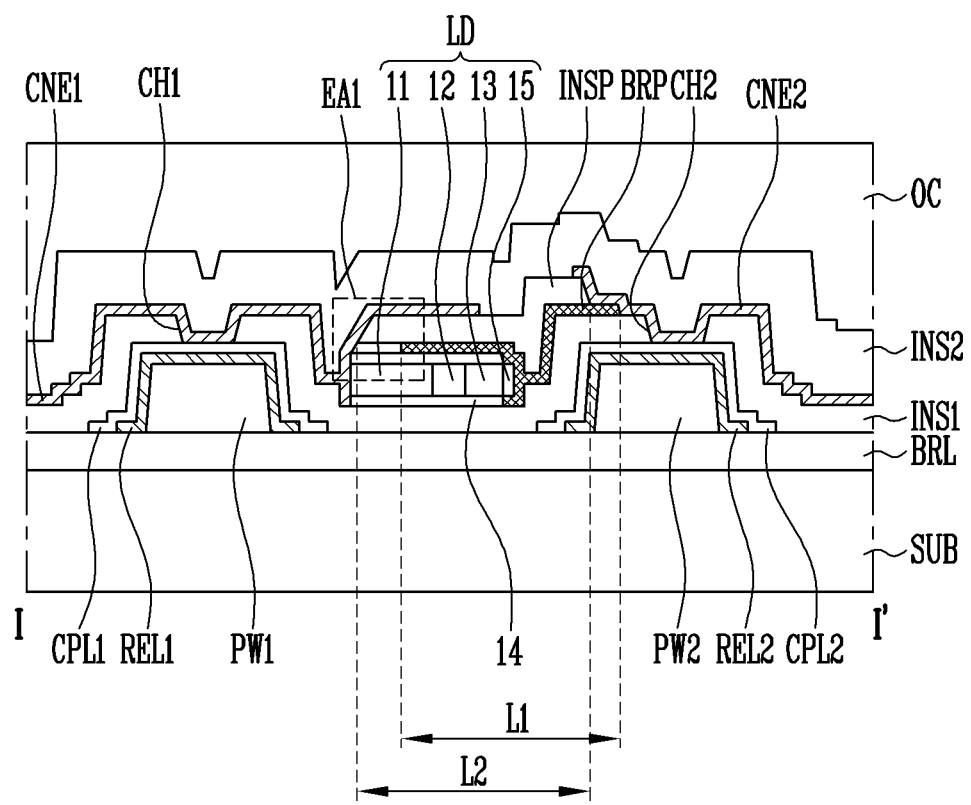
FIG. 4 is a sectional diagram taken along the line I-I' of FIG. 3.
Figure 5:
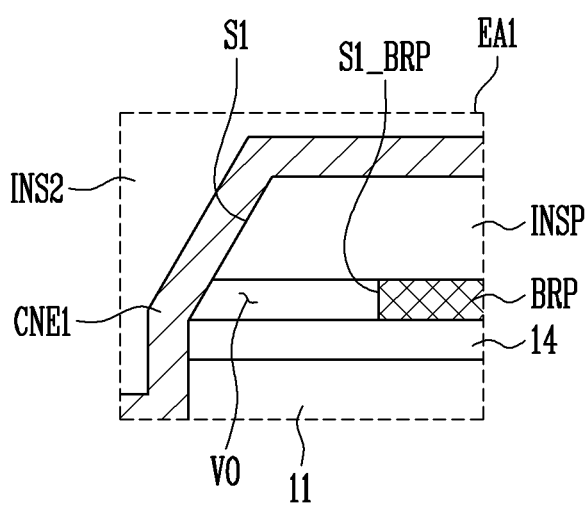
FIG. 5 is an enlarged sectional diagram of the area EA1 of FIG. 4.
Figure 6A:
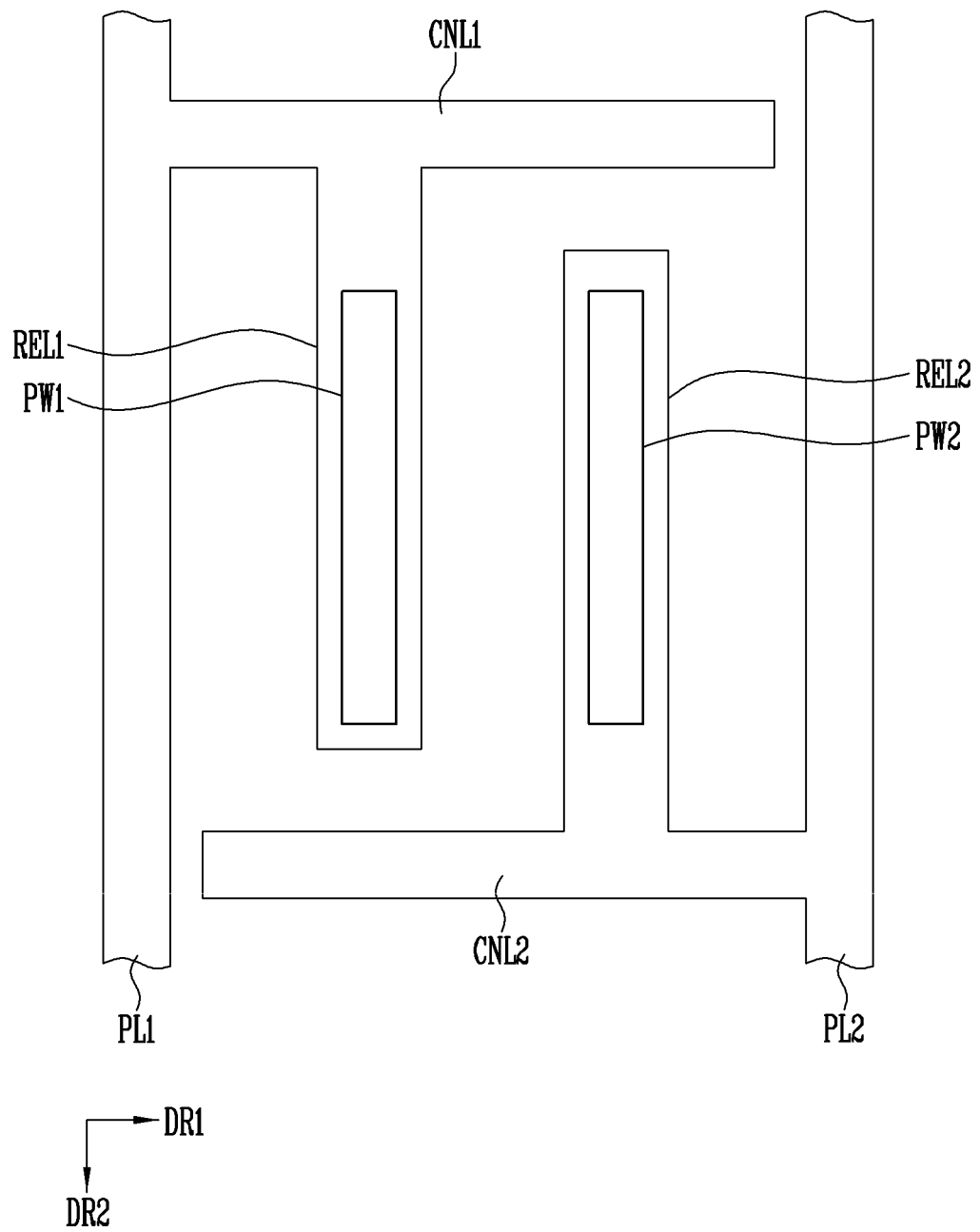
FIGS. 6a to 6f are schematic plan diagrams sequentially illustrating a method of fabricating the light emitting device of FIG. 3.
Figure 6B:
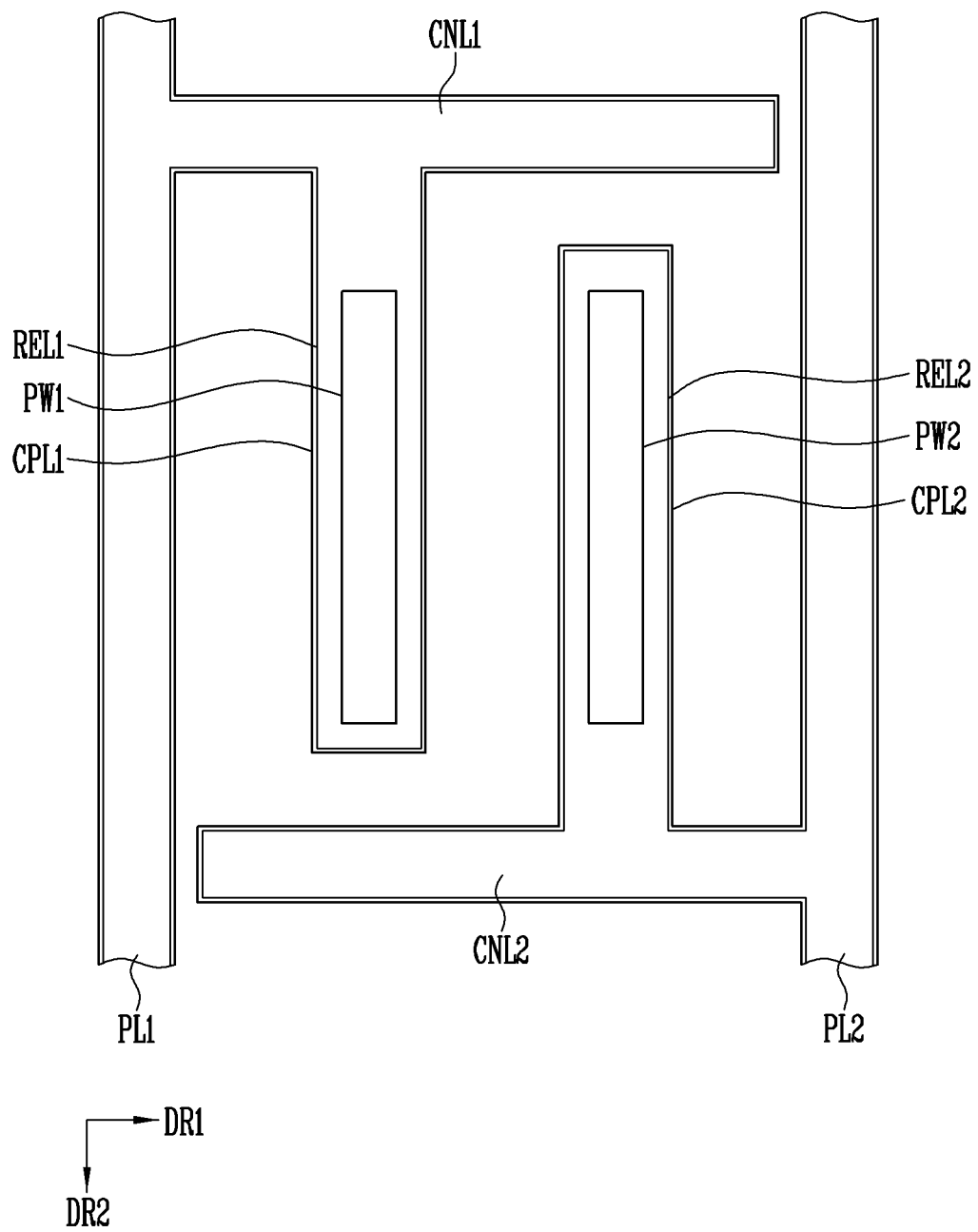
Figure 6C:
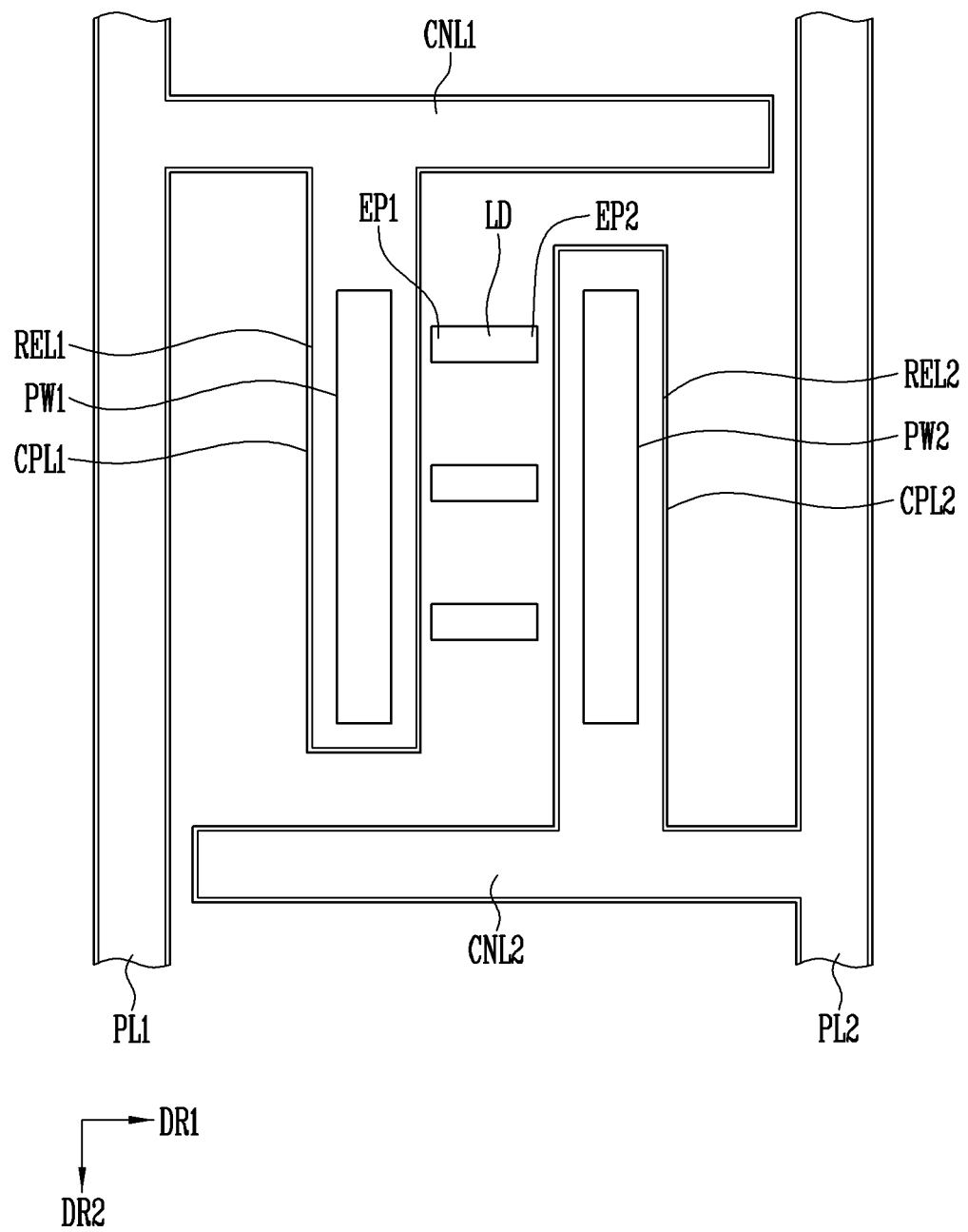
Figure 6D:
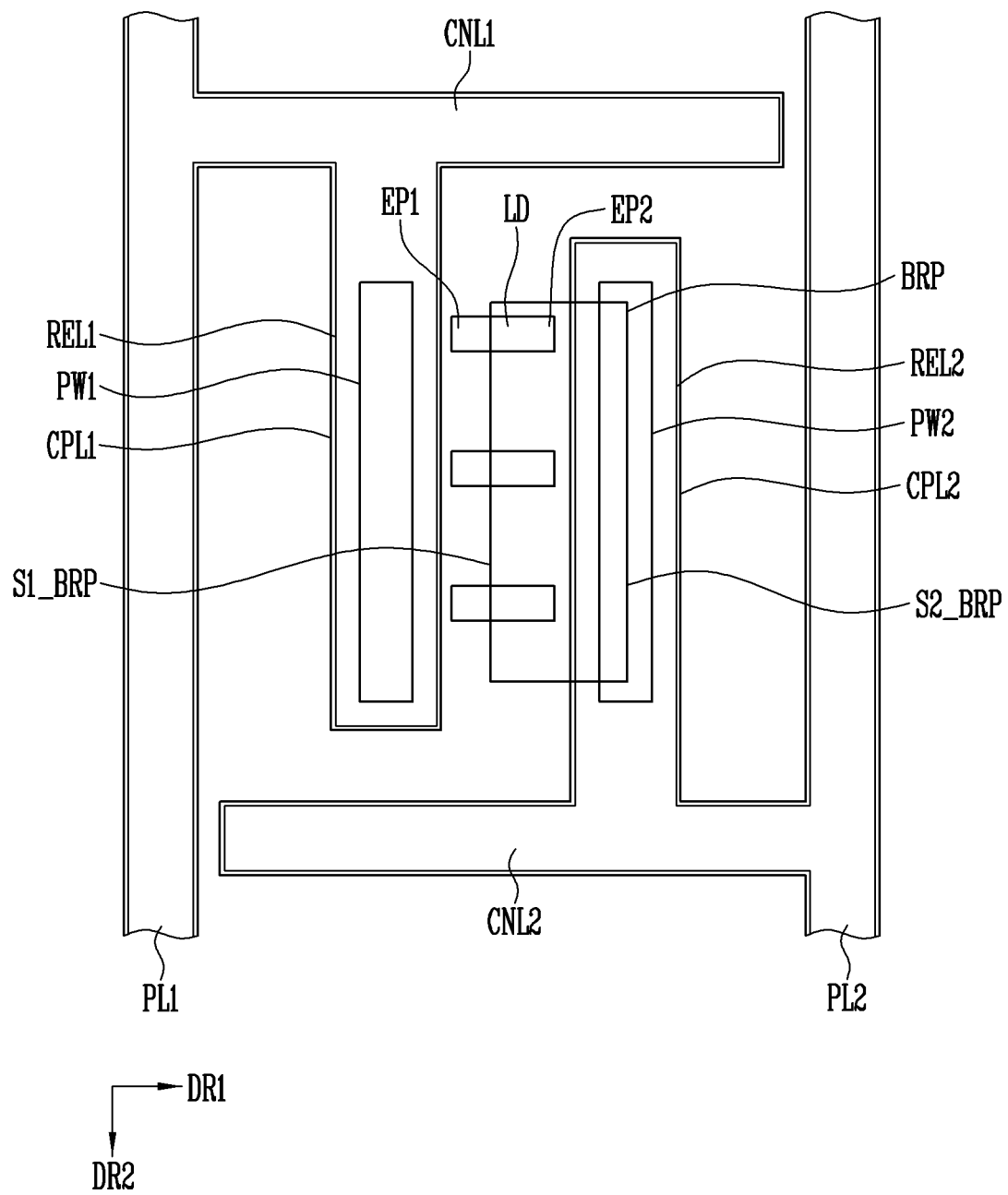
Figure 6E:
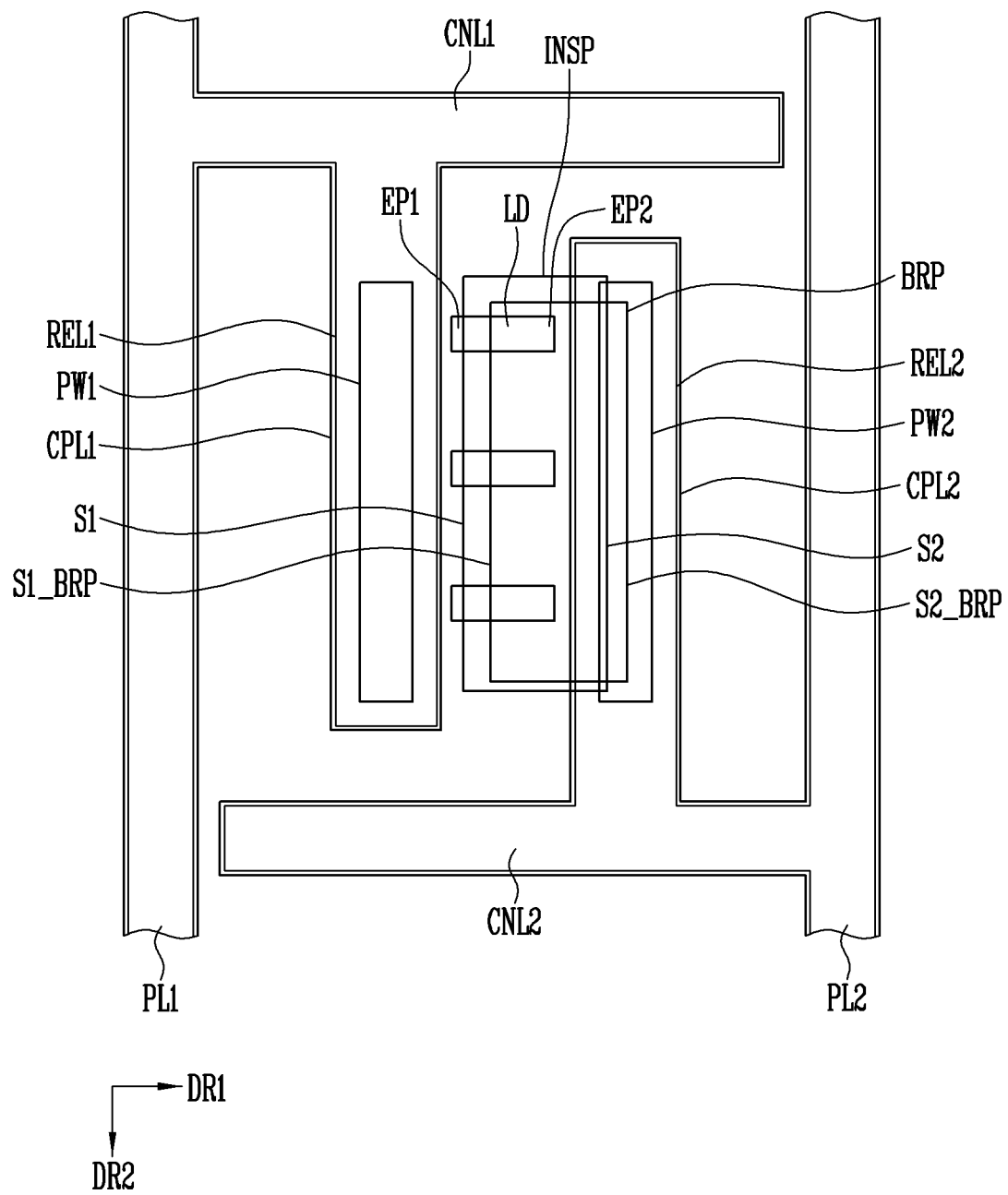
Figure 6F:
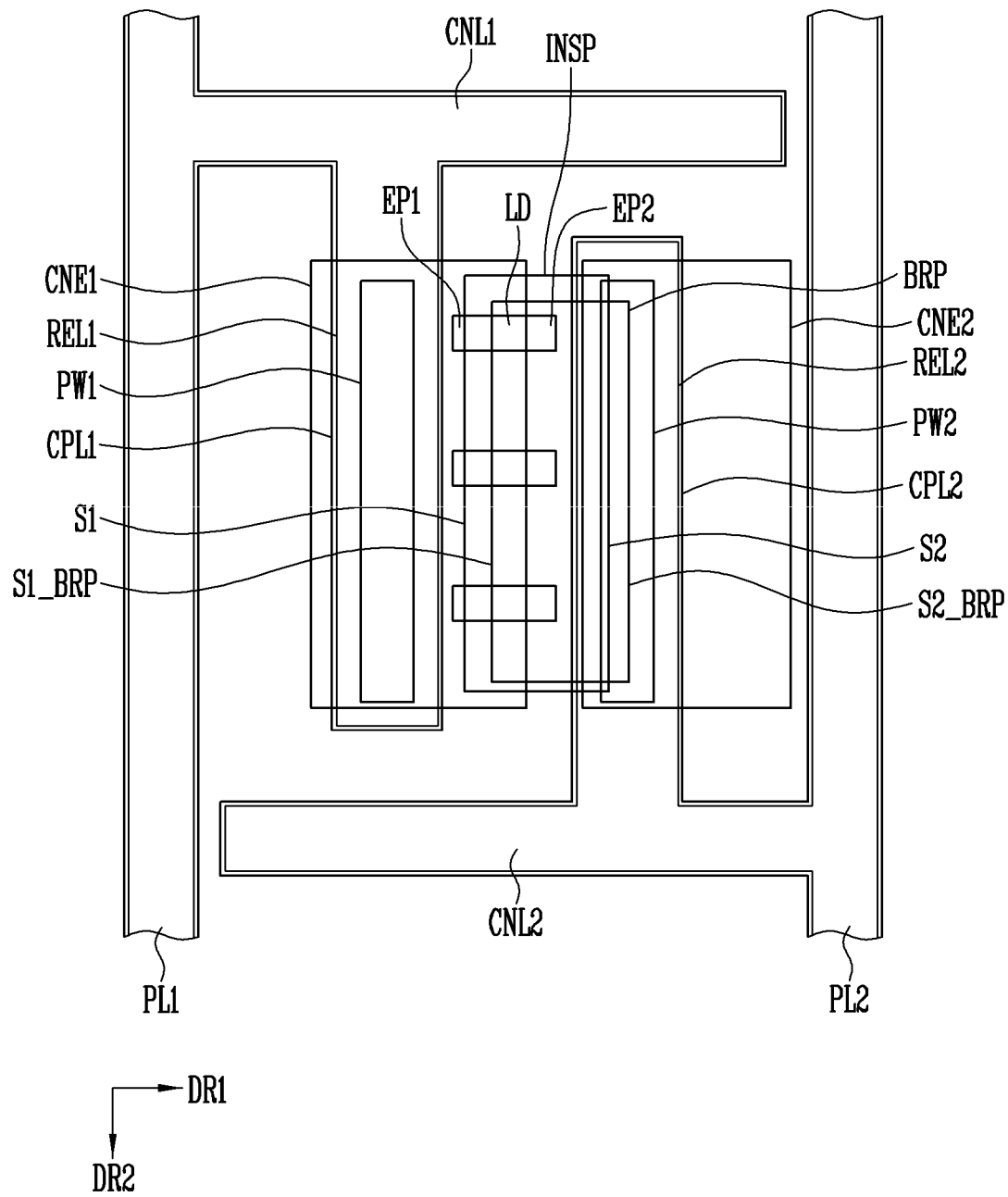

FIG. 3 is a plan diagram illustrating a unit emission area of the light emitting device including the rod-type light emitting diode of FIG. 1. FIG. 4 is a sectional diagram taken along the line I-I' of FIG. 3. FIG. 5 is an enlarged sectional diagram of the area EA1 of FIG. 4.

In FIG. 3, for the sake of explanation, a plurality of rod-type LEDs are illustrated as being horizontally arranged. However, the arrangement of the rod-type LEDs is not limited thereto. For example, the rod-type LEDs may be oriented in an oblique direction between first and second electrodes. In FIG. 3, the unit emission area may be a pixel area of one of the sub-pixels included in an emission display panel.

Referring to FIGS. 1 to 5, the light emitting device in accordance with some embodiments of the present disclosure may include a substrate SUB, a barrier layer BRL, first and second banks (or first and second partition walls) PW1 and PW2, first and second electrodes REL1 and REL2, first and second power lines PL1 and PL2, a plurality of rod-type LEDs LD, and first and second contact electrodes CNE1 and CNE2.

The substrate SUB may include an insulating material such as glass, an organic polymer, or crystal. Furthermore, the substrate SUB may be made of material having flexibility so as to be bendable or foldable, and have a single-layer or multi-layer structure.

The barrier layer BRL may reduce or prevent impurities from diffusing into the rod-type LEDs LD.

The first and second partition walls PW1 and PW2 may be provided on the substrate SUB and define a unit emission area of the light emitting device.

The first and second partition walls PW1 and PW2 may be disposed on the substrate SUB at positions spaced apart from each other by a distance. For example, the first and second partition walls PW1 and PW2 may be disposed on the substrate SUB at positions spaced apart from each other by a distance equal to or greater than the length of one rod-type LED LD.

The first and second partition walls PW1 and PW2 may be formed of insulating material including inorganic material or organic material, but the present disclosure is not limited thereto.

Although each of the first and second partition walls PW1 and PW2 have a trapezoidal shape having side surfaces inclined at an angle, the present disclosure is not limited to thereto. For example, the first and second partition walls PW1 and PW2 may have various shapes such as a semi-elliptical shape, a circular shape, and a rectangular shape.

The first electrode REL1 and the second electrode REL2 may be respectively provided on the corresponding partition walls. For example, the first electrode REL1 may be provided on the first partition wall PW1, and the second electrode REL2 may be provided on the second partition wall PW2.

The first and second electrodes REL1 and REL2 may respectively have shapes corresponding to those of the first and second partition walls PW1 and PW2. Therefore, the first electrode REL1 may have a shape corresponding to an inclination of the first partition wall PW1, and the second electrode REL2 may have a shape corresponding to an inclination of the second partition wall PW2.

The first and second electrodes REL1 and REL2 may be provided on the substrate SUB at positions spaced apart from each other with one or more rod-type LEDs LD interposed therebetween.

In some embodiments of the present disclosure, the first electrode REL1 may be disposed adjacent to respective first ends EP1 of the rod-type LEDs LD, and may be electrically coupled to the respective rod-type LEDs LD through the first contact electrode CNE1. The second electrode REL2 may be disposed adjacent to respective second ends EP2 of the rod-type LEDs LD, and may be electrically coupled to the respective rod-type LEDs LD through the second contact electrode CNE2.

The first electrode REL1 and the second electrode REL2 may be disposed on the same plane, and have the same height. If the first electrode REL1 and the second electrode REL2 have the same height, the rod-type LED LD may be more reliably coupled to the first and second electrodes REL1 and REL2.

The first and second electrodes REL1 and REL2 may be formed of conductive material. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Each of the first and second electrodes REL1 and REL2 may have a single layer structure, but the present disclosure is not limited thereto, for example, it may have a multilayer structure formed by stacking two or more materials of metals, alloys, conductive oxides, and conductive polymers.

The material of the first and second electrodes REL1 and REL2 is not limited to the above-mentioned materials. For example, the first and second electrodes REL1 and REL2 may be made of conductive material having a predetermined reflectivity to allow light emitted from the opposite ends EP1 and EP2 of the rod-type LED LD to travel in a direction (e.g., in a frontal direction) in which an image is displayed.

For example, since the first and second electrodes REL1 and REL2 have shapes corresponding to the shapes of the first and second partition walls PW1 and PW2, light emitted from the opposite ends EP1 and EP2 of each of the rod-type LEDs LD may be reflected by the first and second electrodes REL1 and REL2, whereby the light may more effectively travel in the frontal direction. Therefore, the efficiency of light emitted from the rod-type LEDs LD may be enhanced.

In some embodiments of the present disclosure, the first and second partition walls PW1 and PW2, along with the first and second electrodes REL1 and REL2 respectively provided on the first and second partition walls PW1 and PW2, may function as reflective components for enhancing the efficiency of light emitted from each of the rod-type LEDs LD.

Any one of the first and second electrodes REL1 and REL2 may be an anode electrode, and the other may be a cathode electrode. In some embodiments of the present disclosure, the first electrode REL1 may be an anode electrode, and the second electrode REL2 may be cathode electrode.

Although for the sake of explanation the first and second electrodes REL1 and REL2 are illustrated as being directly provided on the substrate SUB, the present disclosure is not limited thereto. For example, a component for enabling the display device to be driven as a passive matrix or an active matrix may be further provided between the substrate SUB and the first and second electrodes REL1 and REL2.

The first electrode REL1 may be coupled to the first power line PL1 through a first connection line CNL1. The second electrode REL2 may be coupled to the second power line PL2 through a second connection line CNL2.

The first connection line CNL1 may be integrally provided with the first electrode REL1. The second connection line CNL2 may be integrally provided with the second electrode REL2.

The first power line PL1 may be disposed on the same layer as that of the first electrode REL1. The second power line PL2 may be disposed on the same layer as that of the second electrode REL2. However, the present disclosure is not limited thereto.

For example, each of the first and second power lines PL1 and PL2 may be provided on a layer different from that of the corresponding electrode. In this case, each of the first and second power lines PL1 and PL2 may be electrically coupled to the corresponding electrode through a contact hole or the like.

A first driving power supply VDD may be applied to the first power line PL1. A second driving power supply VSS having a voltage level different from that of the first driving power supply VDD may be applied to the second power line PL2.

The first driving power supply VDD of the first power line PL1 may be transmitted to the first electrode REL1 through the first connection line CNL1. The second driving power supply VSS of the second power line PL2 may be transmitted to the second electrode REL2 through the second connection line CNL2.

The first driving power supply VDD applied to the first electrode REL1 may be applied to the first end EP1 of each rod-type LED LD through the first contact electrode CNE1. The second driving power supply VSS applied to the second electrode REL2 may be applied to the second end EP2 of each rod-type LED LD through the second contact electrode CNE2.

In some embodiments of the present disclosure, the first and second power lines PL1 and PL2 may be operated as alignment lines for supplying an alignment voltage to the first and second electrodes REL1 and REL2 when the rod-type LEDs LD are aligned on the substrate SUB.

A first capping layer CPL1 may be provided on the first electrode REL1. A second capping layer CPL2 may be provided on the second electrode REL2.

The first and second capping layers CPL1 and CPL2 may respectively reduce or prevent damage otherwise caused to the first and second electrodes REL1 and REL2 due to a defect caused during a process of fabricating the light emitting device, and may respectively reinforce adhesive force between the substrate SUB and the first and second electrodes REL1 and REL2.

The first and second capping layers CPL1 and CPL2 may be formed of transparent conductive material so as to reduce loss of light that is emitted from the rod-type LEDs LD and reflected by the first and second electrodes REL1 and REL2 in the frontal direction.

The first capping layer CPL1 may be directly provided on the first electrode REL1 and may be electrically coupled to the first electrode REL1. The second capping layer CPL2 may be directly provided on the second electrode REL2 and electrically coupled to the second electrode REL2.

A first insulating layer INS1 may be provided on the first and second capping layers CPL1 and CPL2. The first insulating layer INS1 may be provided between the substrate SUB and each of the rod-type LEDs LD.

Space between the substrate SUB and each of the rod-type LEDs LD may be filled with the first insulating layer INS1. The first insulating layer INS1 may stably support the rod-type LED LD and prevent the rod-type LED LD from being removed from an original position thereof.

The first insulating layer INS1 may include a first contact hole CH1 through which a portion of the first capping layer CPL1 is exposed to the outside, and a second contact hole CH2 through which a portion of the second capping layer CPL2 is exposed to the outside.

In some embodiments, if the first and second capping layers CPL1 and CPL2 are omitted, and the first insulating layer INS1 may be directly provided on the first and second electrodes REL1 and REL2. In this case, the first contact hole CH1 of the first insulating layer INS1 may expose a portion of the first electrode REL1 to the outside. The second contact hole CH2 of the first insulating layer INS1 may expose a portion of the second electrode REL2 to the outside.

The first and second contact electrodes CNE1 and CNE2 may be provided on the first insulating layer INS1.

In a plan view, the first contact electrode CNE1 may cover the first electrode REL1 and overlap with the first electrode REL1.

Furthermore, the first contact electrode CNE1 may partially overlap with one of the opposite ends EP1 and EP2 of each rod-type LED LD. For example, the first contact electrode CNE1 may partially overlap with the first end EP1 of each rod-type LED LD.

The first contact electrode CNE1 may be electrically coupled to the first capping layer CPL1 through the first contact hole CH1 of the first insulating layer INS1. Since the first capping layer CPL1 is electrically coupled to the first electrode REL1, the first contact electrode CNE1 may be coupled to the first electrode REL1.

In some embodiments, in the case where the first capping layer CPL1 is omitted, the first contact electrode CNE1 may be directly coupled to the first electrode REL1 through the first contact hole CH1 of the first insulating layer INS1.

In a plan view, the second contact electrode CNE2 may cover the second electrode REL2 and overlap with the second electrode REL2.

The second contact electrode CNE2 may be electrically coupled to the second capping layer CPL2 through the second contact hole CH2 of the first insulating layer INS1. Since the second capping layer CPL2 is electrically coupled to the second electrode REL2, the second contact electrode CNE2 may be coupled to the second electrode REL2.

In some embodiments, in the case where the second capping layer CPL2 is omitted, the second contact electrode CNE2 may be directly coupled to the second electrode REL2 through the second contact hole CH2 of the first insulating layer INS1.

Each of the first and second contact electrodes CNE1 and CNE2 may be formed of transparent conductive material to allow light emitted from each of the rod-type LEDs LD to travel in the frontal direction with little or no loss. For example, the transparent conductive material may include ITO, IZO, ITZO, etc. The material of the first and second contact electrodes CNE1 and CNE2 is not limited to the above-mentioned materials.

In some embodiments of the present disclosure, the first and second contact electrodes CNE1 and CNE2 may be provided on the same plane.

A second insulating layer INS2 may be provided on the first and second contact electrodes CNE1 and CNE2.

The second insulating layer INS2 may prevent the first and second contact electrodes CNE1 and CNE2 from being exposed to the outside, thus reducing or preventing corrosion of the first and second contact electrodes CNE1 and CNE2.

The second insulating layer INS2 may be formed of an inorganic insulating layer including inorganic material, or an organic insulating layer including organic material. Although the second insulating layer INS2 may have a single layer structure as shown in the drawing, the present disclosure is not limited thereto. For example, the second insulating layer INS2 may have a multi-layer structure.

An overcoat layer OC may be provided on the second insulating layer INS2.

The overcoat layer OC may be a planarization layer for mitigating a step difference formed by the first and second partition walls PW1 and PW2, the first and second electrodes REL1 and REL2, the first and second contact electrodes CNE1 and CNE2, etc. that are disposed under the overcoat layer OC.

In addition, the overcoat layer OC may be an encapsulation layer for reducing or preventing penetration of oxygen or water into the rod-type LEDs LD.

In some embodiments, the overcoat layer OC may be omitted. In the case where the overcoat layer OC is omitted, the second insulating layer INS2 may function as an encapsulation layer for preventing oxygen or water from penetrating into the rod-type LEDs LD.

The rod-type LEDs LD may be provided over the substrate SUB between the first and second electrodes REL1 and REL2. The rod-type LEDs LD may be induced to be self-aligned by an electric field formed between the first and second electrodes REL1 and REL2. Here, each of the rod-type LEDs LD may be provided in the form of a rod extending in a first direction DR1.

Each of the rod-type LEDs LD may include a first conductive semiconductor layer 11, a second conductive semiconductor layer 13, and an active layer 12 interposed between the first and second conductive semiconductor layers 11 and 13. In some embodiments, each of the rod-type LEDs LD may further include an electrode layer 15 provided on the second conductive semiconductor layer 13.

The electrode layer 15 may include metal or a metal oxide. For example, chromium (Cr), titanium (Ti), aluminium (Al), gold (Au), nickel (Ni), ITO, and an oxide or alloy thereof may be used alone or in combination with each other. However, the present disclosure is not limited to this.

In the case where each of the rod-type LEDs LD includes the electrode layer 15, there is an advantage in that during a process of forming the second contact electrode CNE2 in a connection junction between the second conductive semiconductor layer 13 and the second electrode REL2, a bonding operation may be performed at a temperature lower than a required temperature.

The first conductive semiconductor layer 11, the active layer 12, the second conductive semiconductor layer 13, and the electrode layer 15 may be sequentially stacked in a longitudinal direction of the rod-type LEDs LD.

Each of the rod-type LED LD may further include an insulating film 14. The insulating film 14 may be provided to enclose at least a portion of an outer circumferential surface of each of the active layer 12 and the first and second conductive semiconductor layers 11 and 13 of the corresponding rod-type LED LD.

In some embodiments of the present disclosure, the first conductive semiconductor layer 11 may include an n-type semiconductor layer, and the second conductive semiconductor layer 13 may include a p-type semiconductor layer.

Due to characteristics of each of the rod-type LEDs LD, the second conductive semiconductor layer 13 including the p-type semiconductor layer may have a width shorter than that of the first conductive semiconductor layer 11.

The first conductive semiconductor layer 11 may be disposed on the first end EP1 of each of the rod-type LEDs LD. The second conductive semiconductor layer 13 may be disposed on the second end EP2 of each of the rod-type LEDs LD.

Each of the rod-type LEDs LD may emit any one color light and/or white light.

As described above, if predetermined voltages are applied to the opposite ends EP1 and EP2 of each of the rod-type LEDs LD, the rod-type LEDs LD may emit light by coupling of electron-hole pairs in the respective active layers 12 of the rod-type LEDs LD.

The light emitting device in accordance with some embodiments of the present disclosure may further include a bridge pattern BRP and an insulating pattern INSP. The bridge pattern BRP may be provided on the rod-type LEDs LD and the first insulating layer INS1.

The bridge pattern BRP may cover portions of the rod-type LEDs LD and partially overlap with the rod-type LEDs LD. For example, as illustrated in FIG. 4, the bridge pattern BRP may overlap with a portion of the first conductive semiconductor layer 11, the active layer 12, the second conductive semiconductor layer 13, and the electrode layer 15 of each of the rod-type LEDs LD. Here, the bridge pattern BRP may be electrically and/or physically coupled to the second conductive semiconductor layer 13 of each of the rod-type LEDs LD.

Furthermore, in a plan view, the bridge pattern BRP may be spaced apart from the first electrode REL1 by a distance, and may partially overlap with the second electrode REL2.

The bridge pattern BRP may be formed of transparent conductive material so as to reduce or minimize loss of light emitted from each of the rod-type LEDs LD.

In some embodiments of the present disclosure, the bridge pattern BRP may be an intermediate medium that electrically connects the second contact electrode CNE2 with the second conductive semiconductor layer 13 of each of the rod-type LEDs LD.

Since the second contact electrode CNE2 is electrically connected with the second electrode REL2, the second electrode REL2 may be coupled to the second conductive semiconductor layer 13 of each of the rod-type LEDs LD through the second contact electrode CNE2 and the bridge pattern BRP. Consequently, the second driving power supply VSS applied to the second electrode REL2 may be transmitted to the second conductive semiconductor layer 13 of each of the rod-type LEDs LD.

The insulating pattern INSP may be provided on the bridge pattern BRP.

The insulating pattern INSP may partially overlap with the bridge pattern BRP. The insulating pattern INSP may be formed of an inorganic insulating layer including inorganic material, or an organic insulating layer including organic material.

Although the insulating pattern INSP and the bridge pattern BRP each may be provided in the form of a bar extending in a second direction DR2 intersecting with the first direction DR1, the present disclosure is not limited thereto.

A width L2 of the insulating pattern INSP with respect to the first direction DR1 may be equal to or different from a width L1 of the bridge pattern BRP with respect to the first direction DR1.

The insulating pattern INSP may include a first side S1 spaced apart from the first electrode REL1, and a second side S2 that faces the first side S1 and overlaps with the second electrode REL2.

The bridge pattern BRP may include a first side S1_BRP spaced apart from the first electrode REL1, and a second side S2_BRP that faces the first side S1_BRP and overlaps with the second electrode REL2.

In a plan view, the first side S1 of the insulating pattern INSP may be disposed at a position closer to the first electrode REL1 than the first side S1_BRP of the bridge pattern BRP is.

The first side S1_BRP of the bridge pattern BRP may be provided to have an undercut shape when viewed from the first side S1 of the insulating pattern INSP. Since the first side S1_BRP of the bridge pattern BRP has an undercut shape, a void VO may be formed on the first conductive semiconductor layer 11 of each of the rod-type LEDs LD.

The void VO may be defined by being enclosed by a portion of the first conductive semiconductor layer 11 of each of the rod-type LEDs LD, the first side S1_BRP of the bridge pattern BRP, the first side S1 of the insulating pattern INSP (e.g., a bottom of the insulating pattern INSP near the first side S1), and the first contact electrode CNE1.

The first contact electrode CNE1 may be electrically separated from the bridge pattern BRP by the void VO.

In some embodiments of the present disclosure, the first contact electrode CNE1 may be electrically separated from the components of each of the rod-type LEDs LD other than the first conductive semiconductor layer 11 by the void VO and the insulating pattern INSP.

Therefore, the first contact electrode CNE1 may secure a given surface area or more that overlaps with the insulating pattern INSP within a range in which the first contact electrode CNE1 is electrically separated from the second contact electrode CNE2. Thereby, a sufficient amount of contact area between the first conductive semiconductor layer 11 of each of the rod-type LEDs LD and the first contact electrode CNE1 may be secured.

In a plan view, the second contact electrode CNE2 may be disposed on the first insulating layer INS1 at a position spaced apart from the first contact electrode CNE1 by a distance. Hence, the first contact electrode CNE1 and the second contact electrode CNE2 may be electrically separated from each other.

In a plan view, since the second contact electrode CNE2 does not overlap with each of the rod-type LEDs LD, the second contact electrode CNE2 may be physically separated from each of the rod-type LEDs LD. As described above, since the second contact electrode CNE2 is electrically coupled to the bridge pattern BRP, the second contact electrode CNE2 may be electrically coupled to the second conductive semiconductor layer 13 of each of the rod-type LEDs LD through the bridge pattern BRP.

Consequently, depending on the area of the bridge pattern BRP (e.g., the width L1 extending in the first direction DR1), the contact area between the second contact electrode CNE2 and the second conductive semiconductor layer 13 of each of the rod-type LEDs LD may be determined.

In some embodiments of the present disclosure, the bridge pattern BRP may be electrically separated from the first conductive semiconductor layer 11 of each of the rod-type LEDs LD and the first contact electrode CNE1 by the void VO and the insulating pattern INSP.

Therefore, the bridge pattern BRP provided on each rod-type LED LD may secure given surface area or more within a range in which the bridge pattern BRP is electrically separated from the first contact electrode CNE1. As described above, in the case where the bridge pattern BRP secures the given surface area or more, a sufficient amount of contact area between bridge pattern BRP and the second conductive semiconductor layer 13 of each of the rod-type LEDs LD may be secured. Accordingly, a contact rate between the second contact electrode CNE2 and the second conductive semiconductor layer 13 of each of the rod-type LEDs LD may be further improved.

Hereinafter, the configuration of the light emitting device according to some embodiments of the present disclosure will be described in a stacking sequence with reference to FIGS. 3 to 5.

The first and second partition walls PW1 and PW2 may be provided on the substrate SUB on which the barrier layer BRL is provided.

The first electrode REL1 may be provided on the first partition wall PW1. The second electrode REL2 may be provided on the second partition wall PW2. The first and second electrodes REL1 and REL2 may be provided on the same plane on the corresponding partition walls, and may have shapes corresponding to the shapes of the corresponding partition walls.

The first capping layer CPL1 may be provided on the first electrode REL1. The second capping layer CPL2 may be provided on the second electrode REL2.

The first insulating layer INS1 may be provided on the substrate SUB including the first and second capping layers CPL1 and CPL2. The first insulating layer INS1 may include the first and second contact holes CH1 and CH2.

The rod-type LEDs LD may be aligned on the first insulating layer INS1 to correspond to space between the first and second electrodes REL1 and REL2.

The insulating pattern INSP and the bridge pattern BRP may be formed by performing an etching process after a conductive layer (not illustrated) and an insulating material layer (not illustrated) are sequentially applied on the rod-type LEDs LD. The first side S1_BRP of the bridge pattern BRP may be spaced apart from the first side S1 of the insulating pattern INSP in a direction toward the second electrode REL2 by a distance through the etching process. Hence, the first side S1_BRP of the bridge pattern BRP may have an undercut shape when viewed from the first side S1 of the insulating pattern INSP.

The first contact electrode CNE1 that overlaps with the first electrode REL1 and the second contact electrode CNE2 that overlaps with the second electrode REL2 may be provided on the substrate SUB including the insulating pattern INSP. The first and second contact electrodes CNE1 and CNE2 may be provided on the same layer and include the same material.

The second insulating layer INS2 may be provided on the first and second contact electrodes CNE1 and CNE2. The overcoat layer OC may be provided on the second insulating layer INS2.

As described above, in the light emitting device in accordance with some embodiments of the present disclosure, the first and second contact electrodes CNE1 and CNE2 may be simultaneously formed, so that the fabricating process may be simplified.

Furthermore, in the light emitting device in accordance with some embodiments of the present disclosure, the bridge pattern BRP and the insulating pattern INSP are disposed over the rod-type LEDs LD, so that a valid area of each of the first and second contact electrodes CNE1 and CNE2 may be secured. Since the valid area of each of the first and second contact electrodes CNE1 and CNE2 is secured, short failures of the first and second contact electrodes CNE1 and CNE2 may be reduced. Therefore, in the light emitting device in accordance with some embodiments of the present disclosure, contact failures of the rod-type LEDs LD resulting from the short failures of the first and second contact electrodes CNE1 and CNE2 may be reduce or minimized.

Furthermore, since the valid area of each of the first and second contact electrodes CNE1 and CNE2 is secured, a sufficient amount of contact area between the first contact electrode CNE1 and the first conductive semiconductor layer 11 of each of the rod-type LEDs LD and a sufficient amount of contact area between the second contact electrode CNE2 and the second conductive semiconductor layer 13 of each of the rod-type LEDs LD may be secured. Therefore, in the light emitting device in accordance with some embodiments of the present disclosure, contact failures between the first and second contact electrodes CNE1 and CNE2 and the rod-type LEDs LD may be further reduced.

FIGS. 6a to 6f are schematic plan views sequentially illustrating a method of fabricating the light emitting device of FIG. 3. FIGS. 7a to 7j are sectional diagrams sequentially illustrating a method of fabricating the light emitting device illustrated in FIG. 4

Referring to FIGS. 3, 4, 6a, 7a, and 7b, the first and second partition walls PW1 and PW2 extending in the second direction DR2 are formed on the substrate SUB in each unit emission area. The first and second partition walls PW1 and PW2 may be disposed on the substrate SUB at positions spaced apart from each other by a predetermined distance.

Thereafter, the first and second electrodes REL1 and REL2, the first and second connection lines CNL1 and CNL2, and the first and second power lines PL1 and PL2 are formed on the substrate SUB on which the first and second partition walls PW1 and PW2 are provided.

The first electrode REL1 may diverge in the second direction DR2 from the first connection line CNL1 extending in the first direction DR1, which intersects with the second direction DR2. The first electrode REL1 may overlap with the first partition wall PW1.

The first connection line CNL1 may be coupled to the first power line PL1 extending in the second direction DR2.

The first connection line CNL1 may transmit, to the first electrode REL1, an alignment voltage applied to the first power line PL1 when the rod-type LEDs LD are aligned. Furthermore, the first connection line CNL1 may transmit, to the first electrode REL1, the first driving power supply (refer to VDD of FIG. 2a) applied to the first power line PL1 when the rod-type LEDs LD are driven.

The second electrode REL2 may diverge in the second direction DR2 from the second connection line CNL2 extending in the first direction DR1. The second electrode REL2 may overlap with the second partition wall PW2.

The second connection line CNL2 may be coupled to the second power line PL2 extending in the second direction DR2.

The second connection line CNL2 may transmit, to the second electrode REL2, an alignment voltage applied to the second power line PL2 when the rod-type LEDs LD are aligned. Furthermore, the second connection line CNL2 may transmit, to the second electrode REL2, the second driving power supply (refer to VSS of FIG. 2a) applied to the second power line PL2 when the rod-type LEDs LD are driven.

In some embodiments of the present disclosure, the first and second electrodes REL1 and REL2, the first and second connection lines CNL1 and CNL2, and the first and second power lines PL1 and PL2 may be provided on the same plane.

Furthermore, the first and second electrodes REL1 and REL2, the first and second connection lines CNL1 and CNL2, and the first and second power lines PL1 and PL2 may have the same material. For example, the first and second electrodes REL1 and REL2, the first and second connection lines CNL1 and CNL2, and the first and second power lines PL1 and PL2 may have conductive material having a reflectivity.

Referring to FIGS. 3, 4, 6b, and 7a to 7c, the first and second capping layers CPL1 and CPL2 are formed on the substrate SUB on which the first and second electrodes REL1 and REL2, etc. are provided.

The first and second capping layers CPL1 and CPL2 may include the same material. For example, the first and second capping layers CPL1 and CPL2 may include transparent conductive material.

In a plan view, the first capping layer CPL1 may overlap with the first electrode REL1 and the first connection line CNL1, and the second capping layer CPL2 may overlap with the second electrode REL2 and the second connection line CNL2.

Referring to FIGS. 3, 4, 6c, and 7a to 7d, a first insulating material layer INS1' is formed on the substrate SUB on which the first and second capping layers CPL1 and CPL2 are provided.

Thereafter, an electric field is formed between the first and second electrodes REL1 and REL2 by respectively applying alignment voltages to the first and second electrodes REL1 and REL2 through the first and second power lines PL1 and PL2.

While the electric field is formed between the first and second electrodes REL1 and REL2, the rod-type LEDs LD are supplied onto the substrate SUB by an inkjet printing method or the like.

If the rod-type LEDs LD are put onto the substrate SUB, self-alignment of the rod-type LEDs LD may be induced by the electric field formed between the first electrode REL1 and the second electrode REL2. Consequently, the rod-type LEDs LD may be aligned between the first and second electrodes REL1 and REL2.

Each of the rod-type LEDs LD may include a first conductive semiconductor layer 11, an active layer 12, a second conductive semiconductor layer 13, and an electrode layer 15 which are sequentially stacked in the longitudinal direction of the rod-type LEDs LD.

Referring to FIGS. 3, 4, and 7a to 7e, a first conductive layer CL and a second insulating material layer INS2' are sequentially formed on the substrate SUB on which the rod-type LEDs LD are aligned.

The first conductive layer CL may be formed of transparent conductive material so as to reduce or minimize loss of light emitted from each of the rod-type LEDs LD.

The second insulating material layer INS2' may be provided on the first conductive layer CL and include an inorganic insulating layer including inorganic material, or an organic insulating layer including organic material.

Referring to FIGS. 3, 4, 6d, and 7a to 7f, first and second etching processes are sequentially performed so that a bridge pattern BRP and a second insulating material pattern INS2" are formed by simultaneously patterning the first conductive layer CL and the second insulating material layer INS2'.

In some embodiments of the present disclosure, the first etching process may include a dry etching process, and the second etching process may include a wet etching process.

First, the first etching process is performed so that the second insulating material pattern INS2" and a conductive pattern (not illustrated) may be formed by patterning the second insulating material layer INS2' and the first conductive layer CL such that a portion of the first insulating material layer INS1' and a portion of each rod-type LED LD are exposed to the outside.

Although not directly illustrated in the drawings, patterned through the first etching process, opposite sides of the second insulating material pattern INS2" and opposite sides of the conductive pattern may be aligned with each other.

Thereafter, the second etching process is performed using the second insulating material pattern INS2" as an etching mask. A solvent capable of etching the conductive pattern disposed under the second insulating material pattern INS2" is used as an etchant to be employed during the second etching process.

Through the second etching process, the conductive pattern may be formed in an undercut shape under the opposite sides of the second insulating material pattern INS2", thus becoming a bridge pattern BRP having opposite sides S1_BRP and S2_BRP spaced inward apart from the opposite sides of the second insulating material pattern INS2".

In a plan view, the first side S1_BRP of the bridge pattern BRP may be spaced apart from the first electrode REL1 by a distance, and the second side S2_BRP thereof may overlap with the second electrode REL2.

Furthermore, the bridge pattern BRP may overlap with a portion of each rod-type LED LD while not overlapping another portion thereof. Here, the bridge pattern BRP may be electrically coupled to the second conductive semiconductor layer 13 of each of the rod-type LEDs LD.

Referring to FIGS. 3, 4, and 7a to 7g, the first insulating layer INS1 including the first contact hole CH1 and the second contact hole CH2 which expose respective portions of the first and second capping layers CPL1 and CPL2 is formed by patterning the exposed first insulating material layer INS1' through a mask process.

Referring to FIGS. 3, 4, 6e, and 7a to 7h, the insulating pattern INSP through which the second side S2_BRP of the bridge pattern BRP is exposed to the outside is formed by patterning the second insulating material pattern INS2" through the mask process.

The insulating pattern INSP may partially overlap with the bridge pattern BRP. The opposite sides S1 and S2 of the insulating pattern INSP may not be aligned with the opposite sides S1_BRP and S2_BRP of the bridge pattern BRP.

The first side S1 of the insulating pattern INSP may be disposed at a position that is closer to the first electrode REL1 than the first side S1_BRP of the bridge pattern BRP is. Furthermore, the second side S2 of the insulating pattern INSP may be disposed at a position that is closer to the first electrode REL1 than is the second side S2_BRP of the bridge pattern BRP.

Referring to FIGS. 3, 4, 6f, and 7a to 7i, the first and second contact electrodes CNE1 and CNE2 are formed by performing a mask process after a second conductive layer (not illustrated) is formed on the substrate SUB on which the insulating pattern INSP is provided.

The first and second contact electrodes CNE1 and CNE2 may be provided on the same plane, and spaced apart from each other by a distance to be electrically separated from each other. Furthermore, the first and second contact electrodes CNE1 and CNE2 may be formed through the same process.

The first contact electrode CNE1 may be disposed on the insulating pattern INSP and the first insulating layer INS1 including the first contact hole CH1.

The first contact electrode CNE1 may be electrically coupled to the first capping layer CPL1 through the first contact hole CH1. Furthermore, the first contact electrode CNE1 may be electrically coupled with the exposed portion of each rod-type LED LD. Here, the exposed portion of each rod-type LED LD may be the first conductive semiconductor layer 11.

The second contact electrode CNE2 may be disposed on a portion of the insulating pattern INSP and the first insulating layer INS1 including the second contact hole CH2.

The second contact electrode CNE2 may be electrically coupled to the second capping layer CPL2 through the second contact hole CH2. Furthermore, the second contact electrode CNE2 may be electrically coupled to the exposed second side S2_BRP of the bridge pattern BRP. The second contact electrode CNE2 may be electrically coupled to the second conductive semiconductor layer 13 of each rod-type LED LD through the bridge pattern BRP.

As described above, the first and second contact electrodes CNE1 and CNE2 are formed through the same process. Therefore, compared to a light emitting device in which the first and second contact electrodes CNE1 and CNE2 are formed through different processes, the fabricating process according to the present disclosure may be simplified, and the production cost may be reduced by a reduction in number of masks.

Figure 7A:
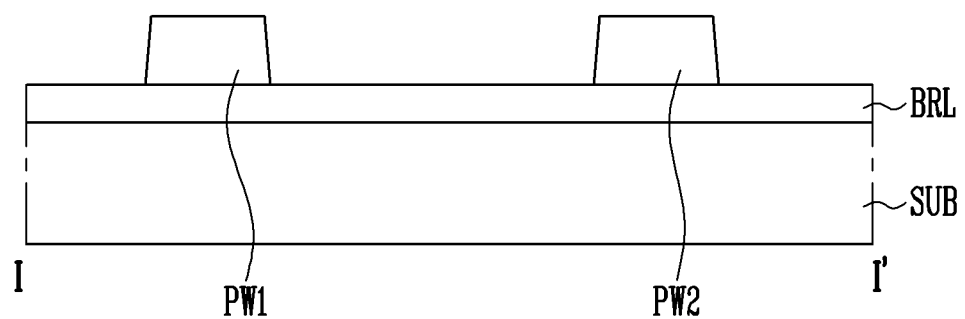
FIGS. 7a to 7j are sectional diagrams sequentially illustrating a method of fabricating the light emitting device illustrated in FIG. 4.
Figure 7B:
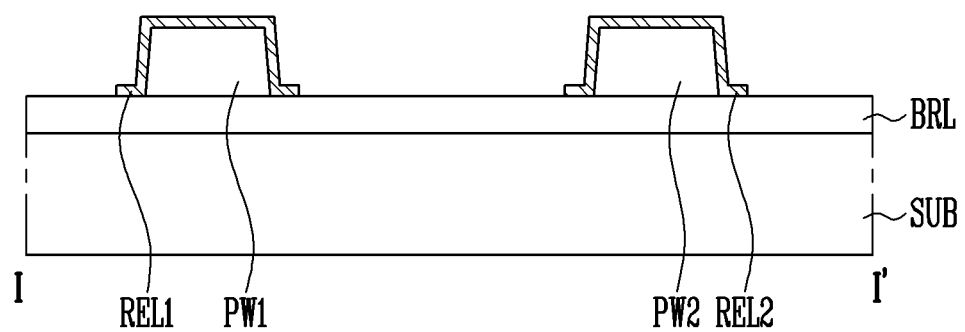
Figure 7C:
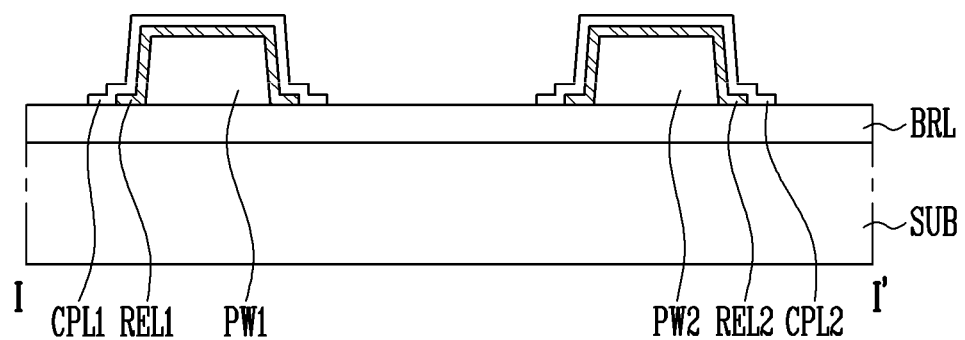
Figure 7D:
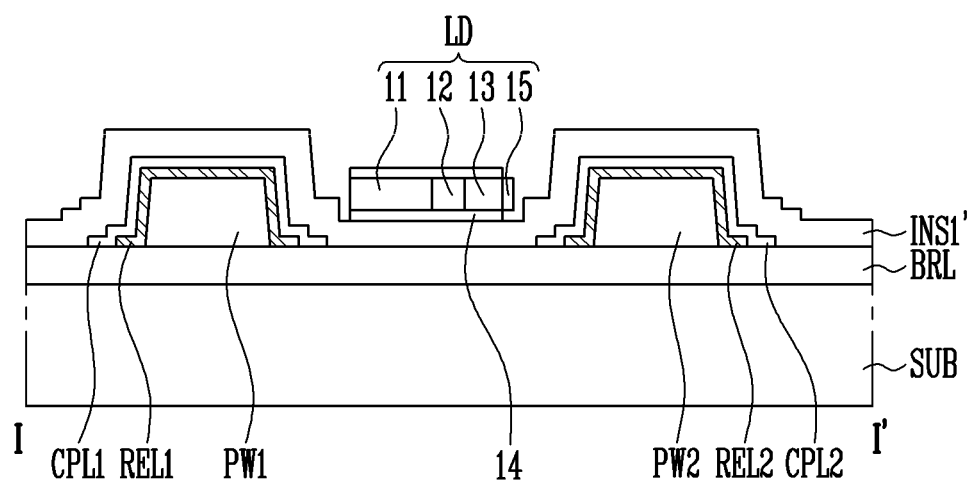
Figure 7E:
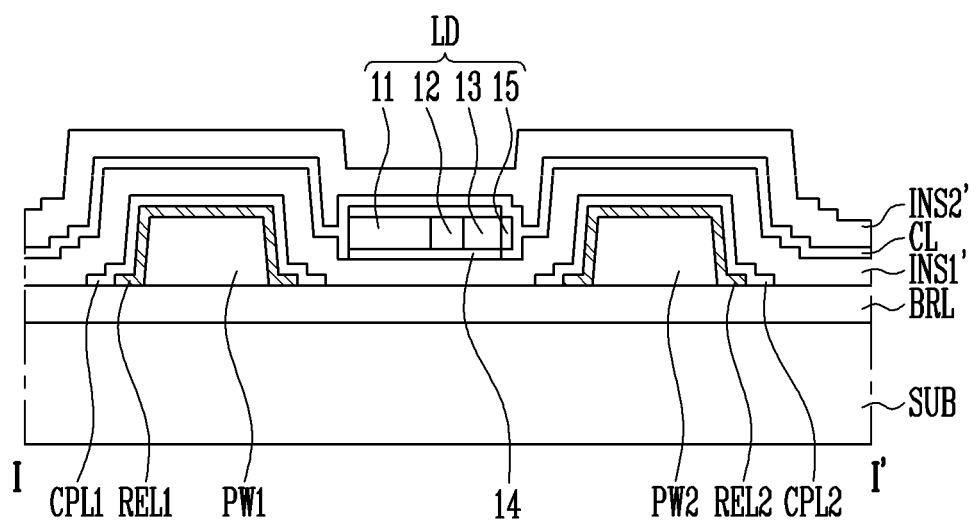
Figure 7F:
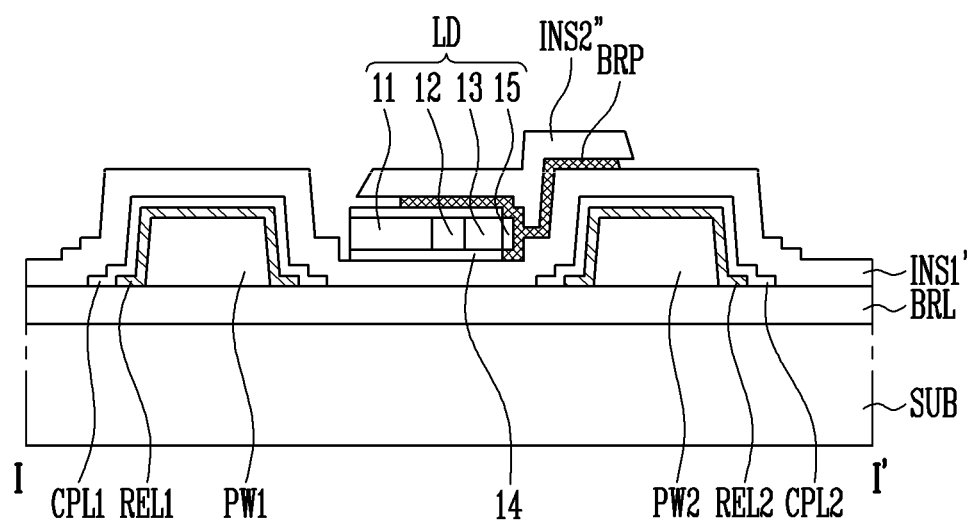
Figure 7G:
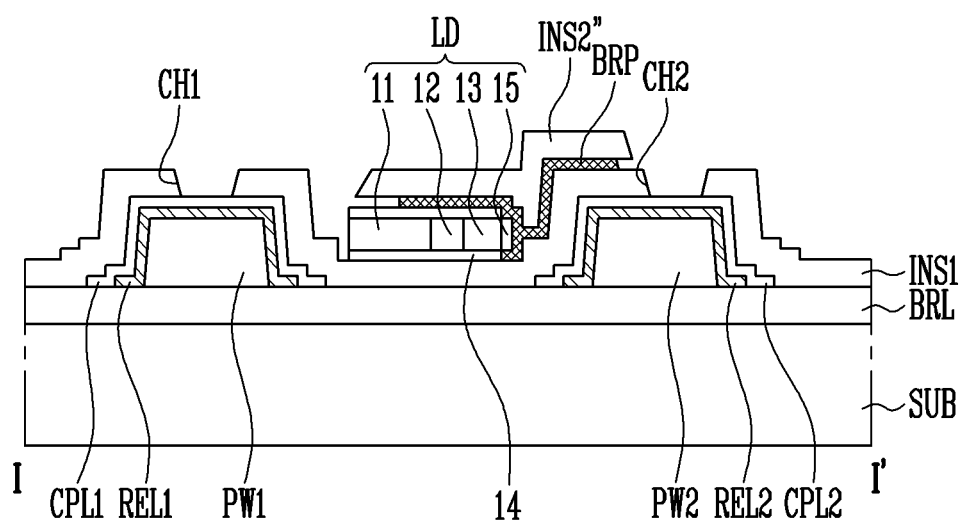
Figure 7H:
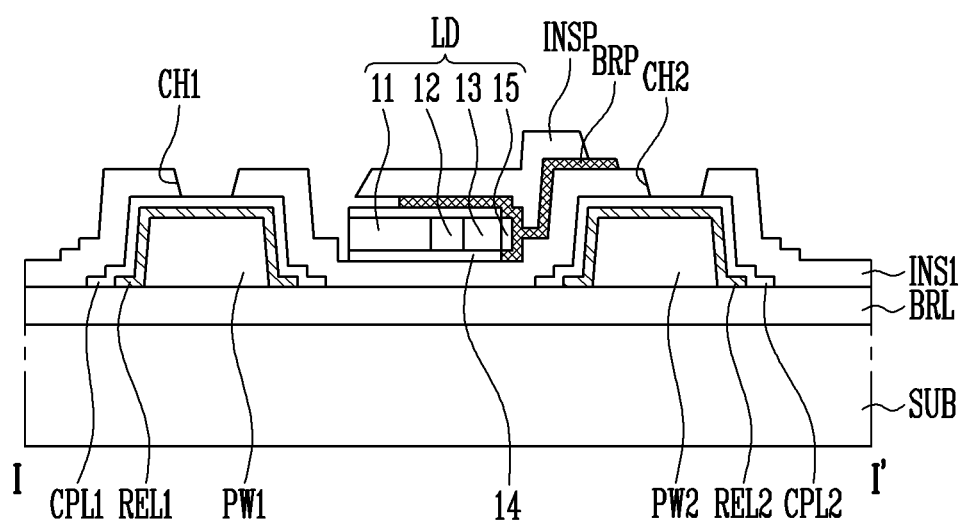
Figure 7I:
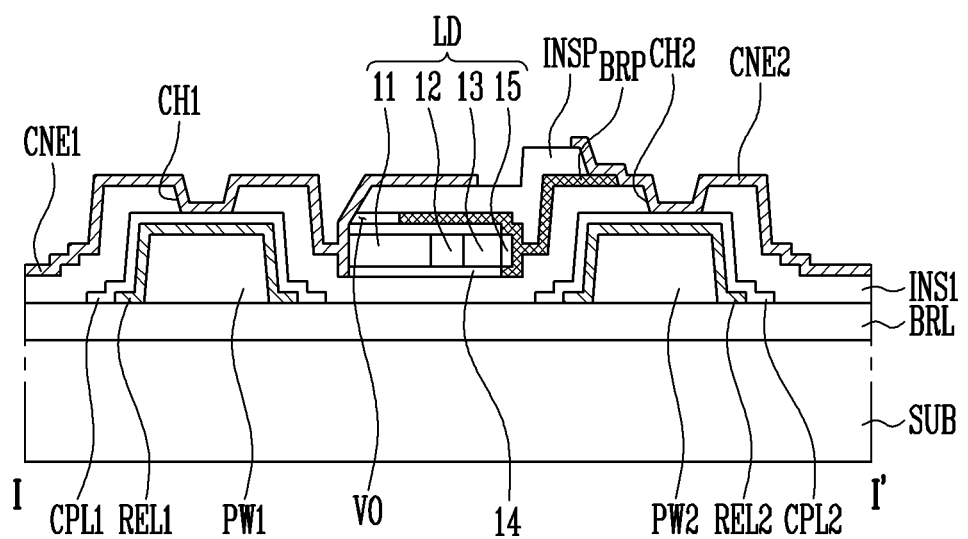
Figure 7J:
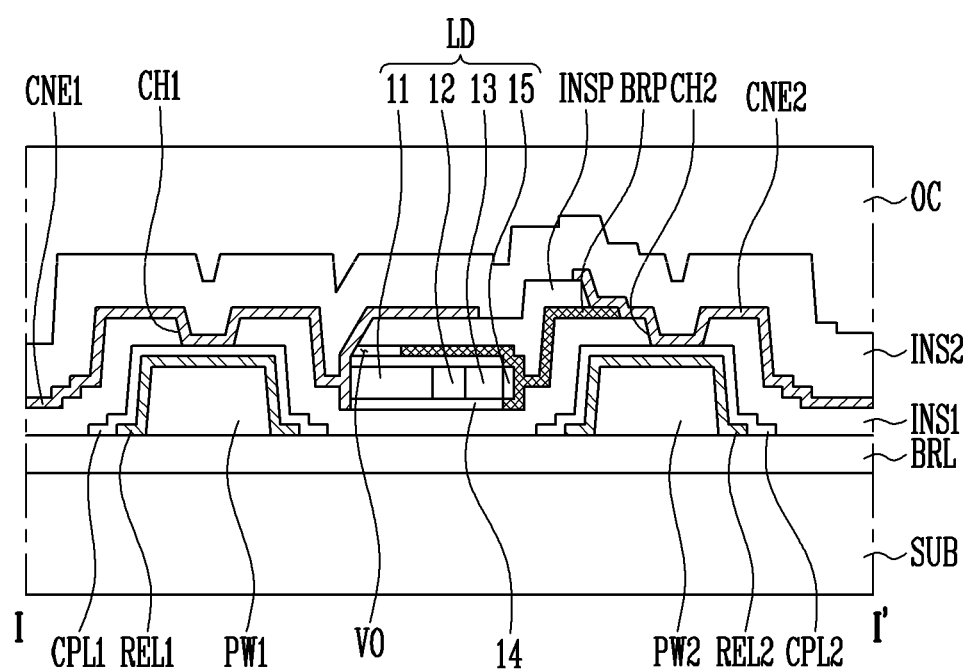

Referring to FIGS. 3, 4, and 7j, the second insulating layer INS2 is formed on the first and second contact electrodes CNE1 and CNE2. Subsequently, the overcoat layer OC is formed on the second insulating layer INS2.

Figure 8:
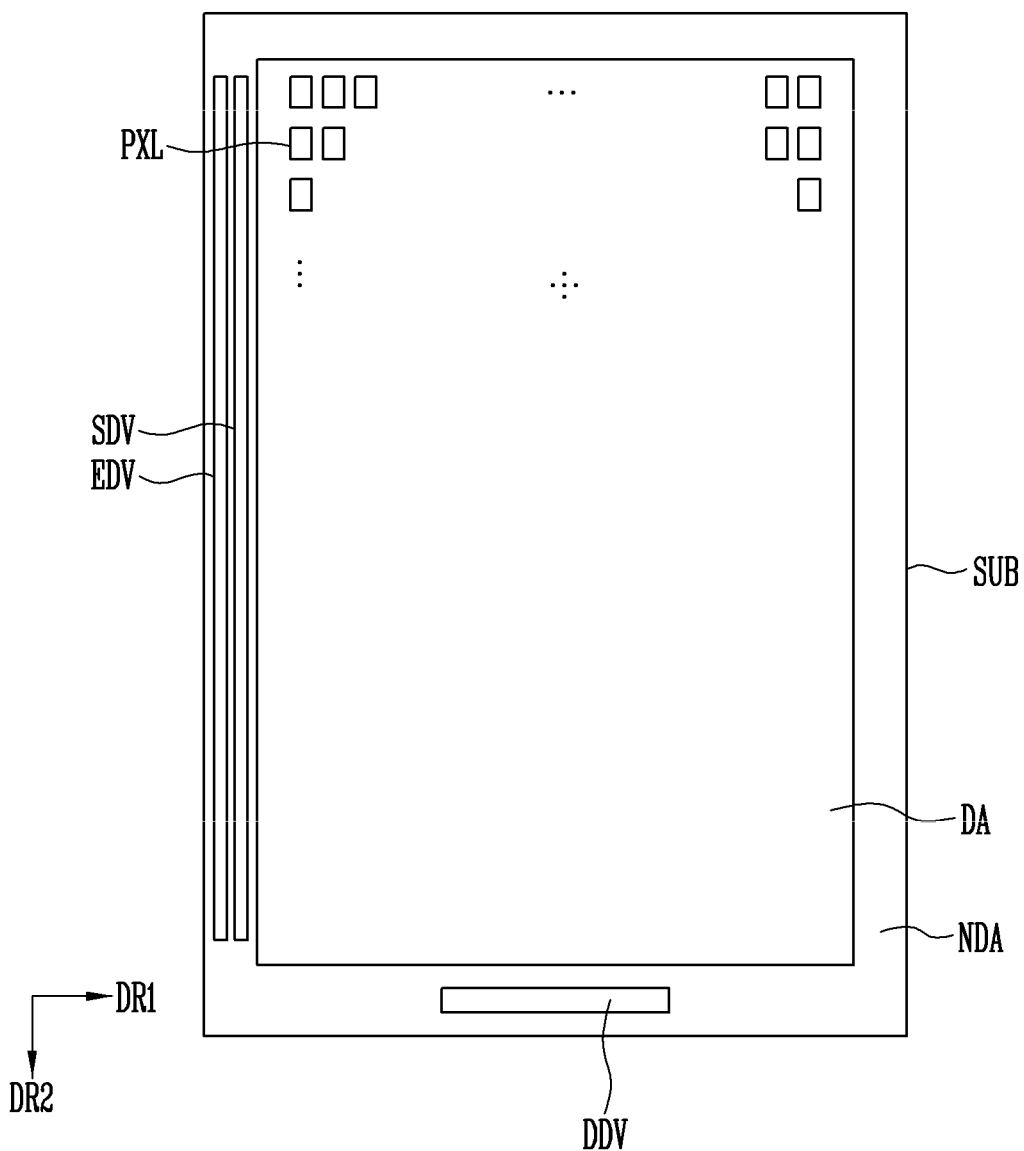
FIG. 8 illustrates a display device in accordance with some embodiments of the present disclosure, and particularly, is a schematic plan diagram illustrating a display device using the rod-type LED illustrated in FIG. 1 as a light emitting source.

FIG. 8 illustrates a display device in accordance with f of the present disclosure, and is a schematic plan diagram illustrating a display device using the rod-type LED illustrated in FIG. 1 as a light emitting source.

Referring to FIGS. 1 and 8, the display device in accordance with some embodiments of the present disclosure includes a substrate SUB, pixels PXL provided on the substrate SUB, a driver provided on the substrate SUB and configured to drive the pixels PXL, and a line component (not illustrated) provided to couple the pixels PXL with the driver.

The substrate SUB may include a display area DA and a non-display area NDA.

The display area DA may be an area in which the pixels PXL for displaying an image are provided. The non-display area NDA may be an area in which the driver for driving the pixels PXL and a part of the line component for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

In the case where the display area DA includes a plurality of areas, each area may also be provided in various forms such as a closed polygon including linear sides, and a semicircle, a semi-ellipse or the like including sides formed of a curved line. The surface areas of the plurality of areas may be the same as or different from each other.

In some embodiments of the present disclosure, there will be described an example in which the display area DA is provided with a single area having a rectangular shape including linear sides.

The non-display area NDA may be provided on at least one side of the display area DA. In some embodiments of the present disclosure, the non-display area NDA may enclose the periphery of the display area DA.

The pixels PXL may be provided in the display area DA on the substrate SUB. Each of the pixels PXL refers to a smallest unit for displaying an image, and a plurality of pixels PXL may be provided.

Each of the pixels PXL may include at least one or more rod-type LEDs LD which emit white light and/or color light. Each pixel PXL may emit light having any one color among red, green, and blue, and it is not limited thereto. For example, each of the pixels PXL may emit light having any one color among cyan, magenta, yellow, and white.

The pixels PXL may be arranged in a matrix form along rows extending in a first direction DR1 and columns extending in a second direction DR2 intersecting with the first direction DR1. However, the arrangement of the pixels PXL is not limited to a particular arrangement. In other words, the pixels PXL may be arranged in various forms.

The driver may provide a signal to each pixel PXL through the line component and thus control the operation of the pixel PXL. In FIG. 8, for the sake of explanation, the line component is omitted.

The driver may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller (not illustrated). The timing controller may control the scan driver SDV, the emission driver EDV, and the data driver DDV.

Figure 9:
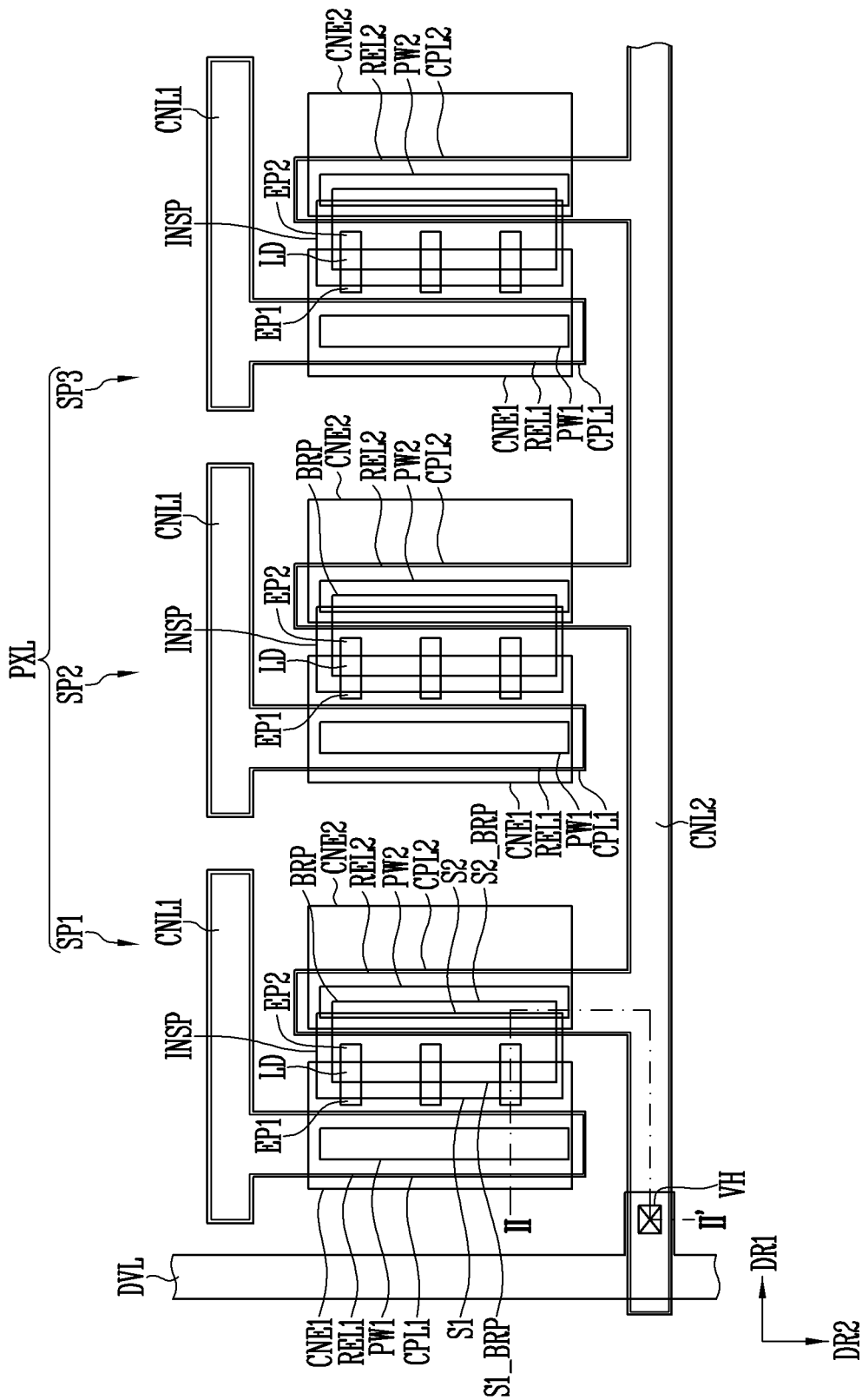
FIG. 9 is a plan diagram schematically illustrating first to third sub-pixels included in one of the pixels illustrated in FIG. 8.
Figure 10:
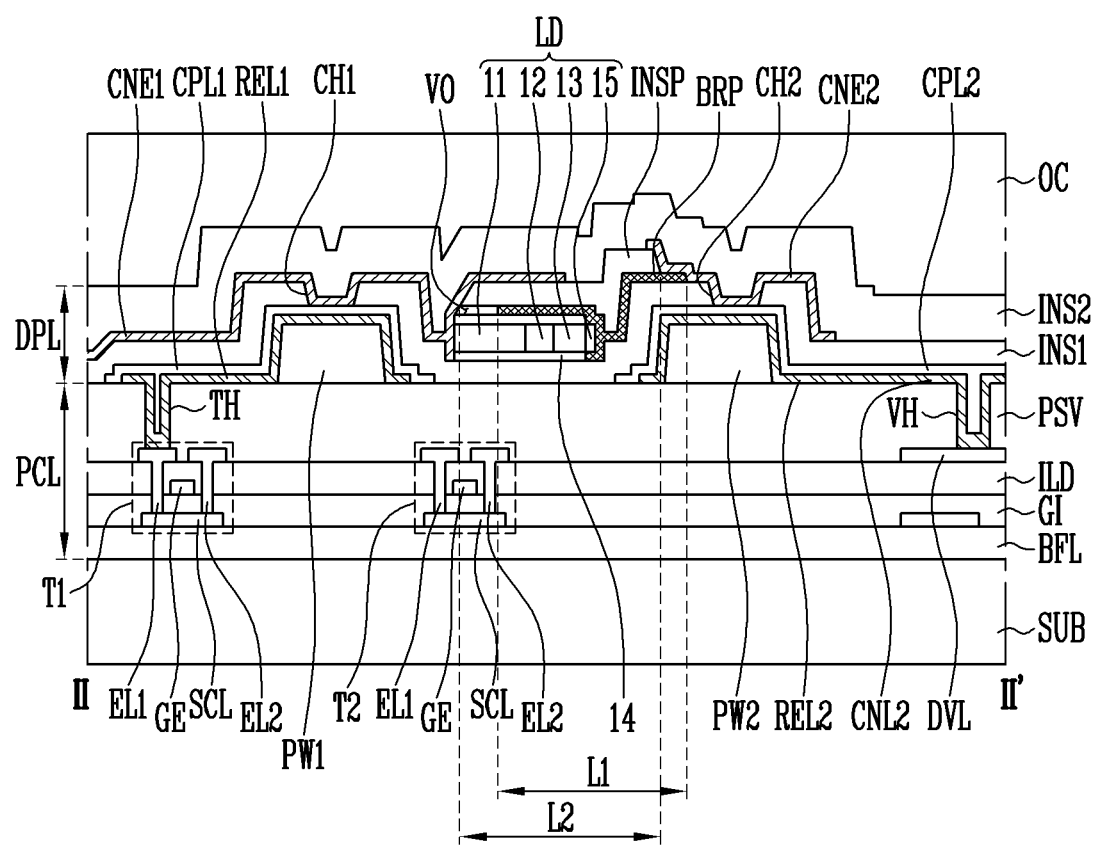
FIG. 10 is a sectional diagram taken along the line II-II' of FIG. 9.

FIG. 9 is a plan diagram schematically illustrating first to third sub-pixels included in one of pixels illustrated in FIG. 8. FIG. 10 is a sectional diagram taken along the line II-II' of FIG. 9. In some embodiments of the present disclosure, the following description will be focused on differences from the foregoing embodiments to avoid repetitive explanation. Components which are not separately explained in the following description of the present embodiment comply with that of the foregoing embodiments. The same reference numeral will be used to designate the same component, and a similar reference numeral will be used to designate a similar component.

In FIG. 9, for the sake of explanation, a plurality of rod-type LEDs provided in each sub-pixel are illustrated as being horizontally arranged. However, the arrangement of the rod-type LEDs is not limited thereto. For example, at least some of the rod-type LEDs may be arranged in a direction intersecting with the horizontal direction.

Furthermore, for the sake of explanation, illustration of transistors coupled to the rod-type LEDs, and signal lines coupled to the transistors has been omitted in FIG. 9. In FIG. 9, the unit emission area may be a pixel area of one sub-pixel.

Referring to FIGS. 8 to 10, the display device in accordance with some embodiments of the present disclosure may include a substrate SUB on which a plurality of pixels PXL are provided.

Each of the pixels PXL may include a first sub-pixel SP1, a second sub-pixel SP2, and a third sub-pixel SP3 which are provided on the substrate SUB.

Each of the first to third sub-pixels SP1, SP2, and SP3 may include the substrate SUB, a pixel circuit layer PCL provided on the substrate SUB, and a display element layer DPL provided on the pixel circuit layer PCL.

The pixel circuit layer PCL may include a buffer layer BFL disposed on the substrate SUB, first and second transistors T1 and T2 disposed on the buffer layer BFL, and a driving voltage line DVL. Furthermore, the pixel circuit layer PCL may further include a passivation layer PSV which is provided on the first and second transistors T1 and T2 and the driving voltage line DVL.

The display element layer DPL may include first and second partition walls PW1 and PW2, first and second electrodes REL1 and REL2, first and second connection lines CNL1 and CNL2, rod-type LEDs LD, and first and second contact electrodes CNE1 and CNE2, which are provided on the passivation layer PSV.

For convenience sake, the display element layer DPL will be described after the pixel circuit layer PCL is described.

The substrate SUB may include an insulating material such as glass, an organic polymer, or crystal. Furthermore, the substrate SUB may be made of material having flexibility so as to be bendable or foldable, and may have a single-layer or multi-layer structure.

The buffer layer BFL may be provided on the substrate SUB and may reduce or prevent diffusion of impurities into the first and second transistors T1 and T2. The buffer layer BFL may be provided in a single-layer structure or a multi-layer structure having at least two or more layers.

In the case where the buffer layer BFL has a multi-layer structure, the respective layers may be formed of the same material or different materials. The buffer layer BFL may be omitted depending on the material of the substrate SUB or processing conditions.

The first transistor T1 may be a driving transistor which is electrically coupled to some of the rod-type LEDs LD provided in the display element layer DPL to drive the corresponding rod-type LED LD. The second transistor T2 may be a switching transistor configured to switch the first transistor T1.

Each of the first and second transistors T1 and T2 may include a semiconductor layer SCL, a gate electrode GE, and first and second transistor electrodes EL1 and EL2.

The semiconductor layer SCL may be disposed on the buffer layer BFL. The semiconductor layer SCL may include a first area in contact with the first transistor electrode EL1, and a second area in contact with the second transistor electrode EL2. An area between the first area and the second area may be a channel area. In some embodiments of the present disclosure, the first area may be any one of a source area and a drain area, and the second area may be the other area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the first area and the second area may be a semiconductor pattern doped with impurities.

The gate electrode GE may be provided on the semiconductor layer SCL with a gate insulating layer GI interposed therebetween.

The first transistor electrode EL1 and the second transistor electrode EL2 may respectively come into contact with the first area and the second area of the semiconductor layer SCL through contact holes which pass through an interlayer insulating layer ILD and the gate insulating layer GI.

The driving voltage line DVL may be provided on the interlayer insulating layer ILD, but it is not limited thereto. In some embodiments, the driving voltage line DVL may be provided on any one of insulating layers included in the pixel circuit layer PCL. The second driving power supply VSS may be applied to the driving voltage line DVL.

The passivation layer PSV may include a through hole TH through which the first transistor electrode EL1 of the first transistor T1 is exposed, and a via hole VH through which the driving voltage line DVL is exposed.

The first and second partition walls PW1 and PW2 may be disposed on the passivation layer PSV at positions spaced apart from each other by a distance. Each of the first and second partition walls PW1 and PW2 may be provided in a trapezoidal shape having sides inclined at an angle, but are not limited thereto.

The first electrode REL1 may be provided on the first partition wall PW1. The second electrode REL2 may be provided on the second partition wall PW2. Therefore, the first electrode REL1 may have a shape corresponding to that of the first partition wall PW1, and the second electrode REL2 may have a shape corresponding to that of the second partition wall PW2.

The first electrode REL1 may diverge from the first connection line CNL1, which extends in a first direction DR1, in a second direction DR2 that intersects with the first direction DR1. The second electrode REL2 may diverge in the second direction DR2 from the second connection line CNL2, which extends in the first direction DR1.

The first connection line CNL1 provided in the first sub-pixel SP1 may be electrically separated from a first connection line CNL1 provided in the second sub-pixel SP2 that is adjacent to the first sub-pixel SP1. Furthermore, the first connection line CNL1 provided in the second sub-pixel SP2 may be electrically separated from a first connection line CNL1 provided in the third sub-pixel SP3 that is adjacent to the second sub-pixel SP2.

Hence, the first connection line CNL1 provided in one sub-pixel may be electrically separated from the first connection line CNL1 provided in a sub-pixel disposed adjacent to the one sub-pixel. Thus, each of the first to third sub-pixels SP1 to SP3 may be individually driven.

The second connection line CNL2 provided in the first sub-pixel SP1 may be provided in common in the second and third sub-pixels SP2 and SP3 that are disposed adjacent to the first sub-pixel SP1.

In a plan view, the first and second electrodes REL1 and REL2 may be spaced apart from each other by a distance with the rod-type LEDs LD provided therebetween. The first electrode REL1 may be disposed adjacent to any one of the opposite ends EP1 and EP2 of each rod-type LED LD. The second electrode REL2 may be disposed adjacent to the other one of the opposite ends EP1 and EP2 of the rod-type LED LD.

The first and second electrodes REL1 and REL2 may be provided on the same plane.

The first electrode REL1 may be electrically coupled to the first transistor electrode EL1 of the first transistor T1 through the through hole TH of the passivation layer PSV. Hence, a voltage applied to the first transistor T1 may be transmitted to the first electrode REL1.

The second electrode REL2 may be electrically coupled with the driving voltage line DVL through the via hole VH of the passivation layer PSV. Consequently, the second driving power supply (refer to VSS of FIG. 2a) applied to the driving voltage line DVL may be transmitted to the second electrode REL2.

A first capping layer CPL1 may be provided on the first electrode REL1. A second capping layer CPL2 may be provided on the second electrode REL2.

A first insulating layer INS1 may be provided on the first and second capping layers CPL1 and CPL2. The first insulating layer INS1 may include an inorganic insulating layer or an organic insulating layer.

The first insulating layer INS1 may include a first contact hole CH1 through which a portion of the first capping layer CPL1 is exposed, and a second contact hole CH2 through which a portion of the second capping layer CPL2 is exposed.

Each of the rod-type LEDs LD may be provided on the first insulating layer INS1 and aligned between the first and second electrodes REL1 and REL2.

Each of the rod-type LEDs LD may include first and second ends EP1 and EP2 in a longitudinal direction thereof.

Each of the rod-type LEDs LD may include a first conductive semiconductor layer 11, an active layer 12, a second conductive semiconductor layer 13, and an electrode layer 15 which are sequentially stacked in the longitudinal direction. Furthermore, each of the rod-type LEDs LD may further include an insulating film 14 which encloses an outer circumferential surface of each of the first and second conductive semiconductor layers 11 and 13 and the active layer 12.

The first conductive semiconductor layer 11 may be disposed on the first end EP1 of each of the rod-type LEDs LD. The second conductive semiconductor layer 13 may be disposed on the second end EP2 of each of the rod-type LEDs LD. In some embodiments of the present disclosure, the first conductive semiconductor layer 11 may include an n-type semiconductor layer, and the second conductive semiconductor layer 13 may include a p-type semiconductor layer.

The first contact electrode CNE1 for electrically and/or physically reliably coupling the first electrode REL1 with the first conductive semiconductor layer 11 of each rod-type LED LD may be provided on the first electrode REL1.

The first electrode REL1 may be electrically coupled to the first conductive semiconductor layer 11 of each of the rod-type LEDs LD through the first contact electrode CNE1. Therefore, a voltage applied to the first electrode REL1 may be transmitted to the first conductive semiconductor layer 11 of each of the rod-type LEDs LD.

The second contact electrode CNE2 for electrically reliably coupling the second electrode REL2 with the second conductive semiconductor layer 13 of each of the rod-type LEDs LD may be provided on the second electrode REL2.

In some embodiments of the present disclosure, the first and second contact electrodes CNE1 and CNE2 may be provided on the same plane and formed through the same process.

A bridge pattern BRP may be provided on the respective rod-type LEDs LD. An insulating pattern INSP may be provided on the bridge pattern BRP.

In each of the first to third sub-pixels SP1 to SP3, in a plan view, the bridge pattern BRP may be spaced apart from the first electrode REL1 and may partially overlap with the second electrode REL2. Furthermore, in a plan view, the bridge pattern BRP may overlap with the components of each of the rod-type LEDs LD other than the first conductive semiconductor layer 11.

The bridge pattern BRP may be electrically coupled to the second conductive semiconductor layer 13 of each of the rod-type LEDs LD. The bridge pattern BRP may be electrically coupled with the second contact electrode CNE2. The second electrode REL2 may be electrically coupled to the second conductive semiconductor layer 13 of each of the rod-type LEDs LD through the second contact electrode CNE2 and the bridge pattern BRP. The second driving power supply VSS applied to the second electrode REL2 may be transmitted to the second conductive semiconductor layer 13 of each of the rod-type LEDs LD.

Consequently, an electric field having a given voltage or more may be applied to each of the first and second conductive semiconductor layers 11 and 13 of each rod-type LED LD, so that the rod-type LED LD may emit light.

The insulating pattern INSP may be provided on the bridge pattern BRP.

The insulating pattern INSP may cover the bridge pattern BRP to prevent the bridge pattern BRP from being exposed to the outside and electrically separate the bridge pattern BRP from the first contact electrode CNE1.

In a plan view, the insulating pattern INSP may partially overlap with the bridge pattern BRP. In detail, the opposite sides S1 and S2 of the insulating pattern INSP may not be aligned with the opposite sides S1_BRP and S2_BRP of the bridge pattern BRP.

Disposed adjacent to the first electrode REL1, the first side S1_BRP of the opposite sides S1_BRP and S2_BRP of the bridge pattern BRP may be provided to have an undercut shape when viewed from the first side S1 of the insulating pattern INSP. Since the first side S1_BRP of the bridge pattern BRP has an undercut shape, a void VO may be formed on the first conductive semiconductor layer 11 of each of the rod-type LEDs LD.

The void VO may be defined by being enclosed by a portion of the first conductive semiconductor layer 11 of each of the rod-type LEDs LD, the first side S1_BRP of the bridge pattern BRP, the first side S1 of the insulating pattern INSP, and the first contact electrode CNE1.

The first contact electrode CNE1 may be electrically separated from the bridge pattern BRP by the void VO and the insulating pattern INSP.

A second insulating layer INS2 may be provided on the first and second contact electrodes CNE1 and CNE2. The second insulating layer INS2 may cover the first and second contact electrodes CNE1 and CNE2 disposed under the second insulating layer INS2 so that the first and second contact electrodes CNE1 and CNE2 can be prevented from being exposed to the outside.

An overcoat layer OC may be provided on the second insulating layer INS2.

As described above, in the display device in accordance with some embodiments of the present disclosure, the first and second contact electrodes CNE1 and CNE2 may be formed through a single process, so that the fabricating process may be simplified.

Furthermore, in the display device in accordance with some embodiments of the present disclosure, the valid area of the first contact electrode CNE1 coupled to the first conductive semiconductor layer 11 of each of the rod-type LEDs LD, and a sufficient amount of valid area of the second contact electrode CNE2 coupled to the second conductive semiconductor layer 13 of each of the rod-type LEDs LD, may be secured.

Since the valid area of each of the first and second contact electrodes CNE1 and CNE2 is secured, short failures of the first and second contact electrodes CNE1 and CNE2 may be reduced. Therefore, in the display device in accordance with some embodiments of the present disclosure, contact failures of the rod-type LEDs LD resulting from the short failures of the first and second contact electrodes CNE1 and CNE2 may be reduced or minimized.

The display device in accordance with some embodiments of the present disclosure may be employed in various electronic devices. For instance, the display device may be applied to a television, a notebook computer, a cellular phone, a smartphone, a smartpad, a portable multimedia player (PMP), a personal digital assistant (PDA), a navigation device, various kinds of wearable devices such as a smartwatch, etc.

While various exemplary embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims with functional equivalents thereof to be included therein.

The invention claimed is:

1. A light emitting device comprising:
a substrate;
a first electrode provided on the substrate, and a second electrode disposed on a plane identical with a plane of the first electrode at a position spaced apart from the first electrode;
at least one light emitting element provided on the substrate, and including a first end and a second end with respect to a longitudinal direction;
a bridge pattern provided on the light emitting element, and coupled to the second end of the light emitting element;
a first contact electrode provided on the substrate, and coupling the first electrode with the first end of the light emitting element; and
a second contact electrode provided on the substrate, and coupling the bridge pattern with the second electrode.

2. The light emitting device according to claim 1, further comprising an insulating pattern provided on the bridge pattern.

3. The light emitting device according to claim 2, wherein the insulating pattern overlaps with the bridge pattern in a plan view.

4. The light emitting device according to claim 3, wherein each of the bridge pattern and the insulating pattern includes a first end adjacent to the first electrode, and a second end opposite to the first end of itself.

5. The light emitting device according to claim 4, wherein the first end of the insulating pattern is disposed at a position closer to the first electrode than is the first end of the bridge pattern, and
wherein the second end of the insulating pattern is disposed at a position closer to the first electrode than is the second end of the bridge pattern, and
wherein the second end of the bridge pattern is exposed.

6. The light emitting device according to claim 5, wherein the first contact electrode is provided on the insulating pattern.

7. The light emitting device according to claim 6, further comprising a void enclosed by a portion of an upper surface of the light emitting element, the first end of the bridge pattern, the first end of the insulating pattern, and a portion of the first contact electrode.

8. The light emitting device according to claim 7, wherein the first contact electrode is electrically separated from the bridge pattern.

9. The light emitting device according to claim 5, further comprising an insulating layer provided on the first and the second electrodes,
wherein the insulating layer includes a first contact hole through which a portion of the first electrode is exposed, and a second contact hole through which a portion of the second electrode is exposed.

10. The light emitting device according to claim 9,
wherein the first contact electrode is coupled to the first electrode through the first contact hole, and
wherein the second contact electrode is coupled to the second electrode through the second contact hole, and is coupled to the exposed second end of the bridge pattern.

11. The light emitting device according to claim 1, wherein the light emitting element comprises:
a first semiconductor layer doped with a first conductive dopant;
a second semiconductor layer doped with a second conductive dopant; and
an active layer disposed between the first semiconductor layer and the second semiconductor layer.

12. The light emitting device according to claim 11,
wherein the first semiconductor layer is disposed on the first end of the light emitting element, and the second semiconductor layer is disposed on the second end of the light emitting element, and
wherein the first semiconductor layer includes an n-type semiconductor layer, and the second semiconductor layer includes a p-type semiconductor layer.

13. The light emitting device according to claim 12, wherein the first and the second contact electrodes are provided on an identical layer.

14. A display device comprising:
a substrate including a display area and a non-display area;
a pixel circuit layer provided in the display area, and including at least one transistor; and
a display element layer provided on the pixel circuit layer, and including a plurality of unit emission areas from which light is emitted,
wherein each of the unit emission areas of the display element layer comprises:
a first electrode provided on the pixel circuit layer, and a second electrode disposed on a plane identical with a plane of the first electrode at a position spaced apart from the first electrode;

at least one light emitting element provided on the pixel circuit layer, and including a first end and a second end with respect to a longitudinal direction;

a bridge pattern provided on the light emitting element, and coupled to the second end of the light emitting element;

an insulating pattern provided on the bridge pattern;

a first contact electrode provided on the insulating pattern, and coupling the first electrode with the first end of the light emitting element; and a second contact electrode provided on the pixel circuit layer, and coupling the bridge pattern with the second electrode, and wherein the display element layer further comprises a void enclosed by a portion of an upper surface of the light emitting element, an end of the bridge pattern, an end of the insulating pattern, and a portion of the first contact electrode.

15. The device according to claim 14, wherein the insulating pattern overlaps with the bridge pattern in a plan view.

* * * * *